United States Patent
Furuyama et al.

(10) Patent No.: US 11,478,760 B2
(45) Date of Patent: Oct. 25, 2022

(54) WATERPROOF GAS-PERMEABLE MEMBRANE, WATERPROOF GAS-PERMEABLE MEMBER AND WATERPROOF GAS-PERMEABLE STRUCTURE INCLUDING SAME, AND WATERPROOF SOUND-PERMEABLE MEMBRANE

(71) Applicant: NITTO DENKO CORPORATION, Ibaraki (JP)

(72) Inventors: Satoru Furuyama, Osaka (JP); Masaaki Mori, Osaka (JP); Yuichi Abe, Osaka (JP); Keiko Fujiwara, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 239 days.

(21) Appl. No.: 14/914,978

(22) PCT Filed: Aug. 29, 2014

(86) PCT No.: PCT/JP2014/004452
§ 371 (c)(1),
(2) Date: Feb. 26, 2016

(87) PCT Pub. No.: WO2015/029451
PCT Pub. Date: Mar. 5, 2015

(65) Prior Publication Data
US 2016/0207006 A1     Jul. 21, 2016

(30) Foreign Application Priority Data
Aug. 30, 2013  (JP) .............................. JP2013-179687
Aug. 20, 2014  (JP) .............................. JP2014-167787

(51) Int. Cl.
*B01D 53/22*     (2006.01)
*B01D 69/12*     (2006.01)
(Continued)

(52) U.S. Cl.
CPC ......... *B01D 69/12* (2013.01); *B01D 67/0032* (2013.01); *B01D 67/0088* (2013.01);
(Continued)

(58) Field of Classification Search
CPC ................ B01D 69/10; B01D 2325/38; B01D 67/0088; B01D 69/12; B01D 67/0032;
(Continued)

(56) References Cited

U.S. PATENT DOCUMENTS

| 2,968,327 A | * | 1/1961 | Mariner | .................... E04B 1/86 |
| | | | | 144/365 |
| 4,832,997 A | | 5/1989 | Balanzat et al. | |

(Continued)

FOREIGN PATENT DOCUMENTS

| JP | 62-037556 U | 3/1987 |
| JP | 63-099503 U | 6/1988 |

(Continued)

OTHER PUBLICATIONS

NASA "What Wavelength Goes With a Color" 2 pages, Feb. 7, 2017, https://science-edu.larc.nasa.gov/EDDOCS/Wavelengths_for_Colors.html.*
(Continued)

*Primary Examiner* — Anthony R Shumate
(74) *Attorney, Agent, or Firm* — Hamre, Schumann, Mueller & Larson, P.C.

(57) ABSTRACT

Provided is a waterproof gas-permeable membrane (1) having higher levels of both gas permeability and waterproofness than conventional ones. The waterproof gas-permeable membrane (1) includes: a non-porous resin film (2) having (Continued)

through holes (21*a* to 21*g*) formed to extend through the thickness of the resin film (2); and a liquid-repellent layer (3) formed on a principal surface of the resin film (2) and having openings (31) positioned in register with the through holes (21*a* to 21*g*). The through holes (21*a* to 21*g*) extend straight and have a diameter of 15 μm or less. The through holes (21*a* to 21*g*) are distributed at a hole density of $1 \times 10^3$ holes/cm$^2$ or more and $1 \times 10^9$ holes/cm$^2$ or less in the resin film (2). The through holes (21*a* to 21*g*) extend in oblique directions with respect to a direction perpendicular to the principal surface of the resin film (2). The through holes (21*a* to 21*g*) that extend in different oblique directions are present together.

24 Claims, 14 Drawing Sheets

(51) Int. Cl.

| | | |
|---|---|---|
| *B32B 3/26* | (2006.01) | |
| *H05K 5/02* | (2006.01) | |
| *H04R 1/08* | (2006.01) | |
| *B32B 3/04* | (2006.01) | |
| *H04R 1/02* | (2006.01) | |
| *B01D 67/00* | (2006.01) | |
| *B01D 71/48* | (2006.01) | |
| *B01D 69/10* | (2006.01) | |
| *B32B 27/06* | (2006.01) | |

(52) U.S. Cl.
CPC ............. *B01D 69/10* (2013.01); *B01D 71/48* (2013.01); *B32B 3/04* (2013.01); *B32B 3/266* (2013.01); *B32B 27/06* (2013.01); *H04R 1/023* (2013.01); *H04R 1/086* (2013.01); *H05K 5/0213* (2013.01); *B01D 2325/38* (2013.01); *B32B 2307/10* (2013.01); *B32B 2307/724* (2013.01); *B32B 2307/7265* (2013.01); *B32B 2307/73* (2013.01); *B32B 2457/00* (2013.01); *H04R 2499/11* (2013.01)

(58) Field of Classification Search
CPC ............... B01D 71/48; B32B 2307/10; B32B 2307/724; B32B 27/06; B32B 2307/7265; B32B 3/04; B32B 2307/73; B32B 3/266; B32B 2457/00; H05K 5/0213; H04R 1/086; H04R 1/023; H04R 2499/11
See application file for complete search history.

(56) References Cited

U.S. PATENT DOCUMENTS

| | | | |
|---|---|---|---|
| 4,855,049 A | 8/1989 | Toulemonde et al. | |
| 6,120,875 A | 9/2000 | Haumont et al. | |
| 6,130,175 A * | 10/2000 | Rusch ................... | B01D 69/10 |
| | | | 428/306.6 |
| 6,497,752 B1 * | 12/2002 | Kessler ................ | B01D 67/003 |
| | | | 96/14 |
| 9,005,334 B2 | 4/2015 | Furuyama et al. | |
| 9,171,535 B2 | 10/2015 | Abe et al. | |
| 2004/0195173 A1 * | 10/2004 | Huang ............... | B01D 67/0083 |
| | | | 210/489 |
| 2004/0198121 A1 * | 10/2004 | Huang ................... | B32B 9/047 |
| | | | 442/76 |
| 2005/0230353 A1 | 10/2005 | Danziger | |
| 2005/0260256 A1 * | 11/2005 | Hill ....................... | A61K 9/1277 |
| | | | 264/4.1 |
| 2006/0090958 A1 * | 5/2006 | Coates ................. | G10K 11/168 |
| | | | 181/290 |
| 2007/0293600 A1 * | 12/2007 | Tamura ................... | A61L 29/06 |
| | | | 523/136 |
| 2008/0053749 A1 * | 3/2008 | Utsunomiya .......... | G03B 21/16 |
| | | | 181/284 |
| 2010/0297531 A1 * | 11/2010 | Liu ........................ | B01D 61/38 |
| | | | 429/498 |
| 2013/0074691 A1 * | 3/2013 | Furuyama .............. | B01D 46/54 |
| | | | 95/45 |
| 2013/0333978 A1 * | 12/2013 | Abe ...................... | G10K 11/002 |
| | | | 181/291 |
| 2014/0138181 A1 * | 5/2014 | Mori ...................... | G10K 11/18 |
| | | | 181/292 |
| 2015/0050464 A1 | 2/2015 | Ishii et al. | |
| 2015/0231577 A1 * | 8/2015 | Nair ..................... | B01D 71/024 |
| | | | 210/640 |
| 2016/0111076 A1 * | 4/2016 | Qian ................... | G10K 11/165 |
| | | | 181/293 |

FOREIGN PATENT DOCUMENTS

| | | | | |
|---|---|---|---|---|
| JP | 4-228716 | | 8/1992 | |
| JP | 5-295145 | | 11/1993 | |
| JP | 8-027561 | | 1/1996 | |
| JP | 63-154750 | | 6/1999 | |
| JP | 2000-201388 | | 7/2000 | |
| JP | 2001-073592 | | 3/2001 | |
| JP | 2001-277401 | | 10/2001 | |
| JP | 2003-053872 | | 2/2003 | |
| JP | 2003-318557 | | 11/2003 | |
| JP | 2007-296952 | | 11/2007 | |
| JP | WO 2011158408 A1 * | 12/2011 | ............. B01D 46/54 |
| JP | 2012-020279 | | 2/2012 | |
| JP | WO 2012117476 A1 * | 9/2012 | .......... G10K 11/002 |
| JP | 2012-195928 | | 10/2012 | |
| JP | 2013-253213 | | 12/2013 | |

OTHER PUBLICATIONS

Yamauchi Translation of JP2007296952A_MT 3 pages, Jun. 28, 1988.*
Arakawa Translation of JP63099503U 12 pages, Nov. 15, 2007.*
Robeson "Correlation of separation factor versus permeability for polymeric membranes", Journal of Membrane Science, 62 ( 1991) 165-185 (Year: 1991).*
Extended European Search Report issued for corresponding European Patent Application No. 14839773.0, dated May 4, 2017, 11 pages.

* cited by examiner

ND WATERPROOF
WATERPROOF GAS-PERMEABLE MEMBRANE, WATERPROOF GAS-PERMEABLE MEMBER AND WATERPROOF GAS-PERMEABLE STRUCTURE INCLUDING SAME, AND WATERPROOF SOUND-PERMEABLE MEMBRANE

TECHNICAL FIELD

The present invention relates to a waterproof gas-permeable membrane having both waterproofness and gas permeability, a waterproof gas-permeable member and a waterproof gas-permeable structure that include the waterproof gas-permeable membrane. The present invention also relates to a waterproof sound-permeable membrane having both waterproofness and sound permeability.

BACKGROUND ART

Various housings are often provided with openings for maintaining ventilation between the outside and inside of the housings, examples of which include: a housing containing an electronic circuit board such as a vehicle ECU (Electrical Control Unit) and a control board for a solar cell; a housing containing an electronic device or components such as a motor, a light source and a sensor; a housing of a household electric appliance such as an electric toothbrush and an electric shaver; and a housing of an information terminal such as a mobile phone. The provision of an opening to a housing makes possible, for example, elimination or reduction of pressure difference occurring between the inside and outside of the housing. The opening is often covered by a waterproof gas-permeable membrane that prevents water from entering the housing from outside through the opening while allowing passage of gas (air in the typical case) between the inside and outside of the housing for maintenance of ventilation, especially when a product contained in the housing is vulnerable to water.

Apart from this, a housing of an electronic device having an audio function, such as a mobile phone and a tablet computer, is provided with an opening for transmission of sound between an audio part placed in the housing and the outside of the electronic device. The audio part is, for example, a sound emitter such as a speaker and/or a sound receiver such as a microphone. Naturally, entry of water into the housing of the electronic device must be prevented; however, the above opening for transmission of sound may constitute a route that permits water to easily enter the housing. Portable electronic devices particularly have an increased risk of suffering from entry of water because they are often exposed to rain or water used in daily life and because the orientation of the opening cannot be fixed at a given orientation that allows the avoidance of water (for example, a downward orientation for which rain is less likely to come into the housing). For this reason, a waterproof sound-permeable membrane that allows transmission of sound between the audio part and the outside of the housing and that also prevents water from entering the housing from outside through the opening is placed to cover the opening.

Examples of the waterproof gas-permeable membrane and the waterproof sound-permeable membrane include a stretched porous membrane having a structure in which a huge number of pores formed by stretching are distributed. Patent Literature 1 and 2 respectively disclose a waterproof gas-permeable membrane and a waterproof sound-permeable membrane including a stretched porous membrane of polytetrafluoroethylene (PTFE). Other examples of the waterproof gas-permeable membrane and the waterproof sound-permeable membrane include a non-porous resin film having through holes formed to extend along the thickness direction of the film (see Patent Literature 3 and 4).

CITATION LIST

Patent Literature

Patent Literature 1: JP 2003-318557 A
Patent Literature 2: JP 2003-53872 A
Patent Literature 3: JP 2012-20279 A
Patent Literature 4: JP 2012-195928 A

SUMMARY OF INVENTION

Technical Problem

In recent years, there has been a demand for a waterproof gas-permeable membrane having high levels of both gas permeability and waterproofness which are conflicting properties, and more particularly a waterproof gas-permeable membrane that has high gas permeability and that, at the same time, can provide high waterproofness. The use of such a waterproof gas-permeable membrane can, for example, maintain a required level of gas permeability even with a reduced area for gas permeation, and thus makes possible reduction in the size of a waterproof gas-permeable structure. This can provide, for example, a further reduction in size and thickness of an electronic device, particularly a portable information terminal, and hence an increase in flexibility of device designing including aesthetic design. With the stretched porous membrane of Patent Literature 1, it is difficult to achieve a good balance between the above two conflicting properties. With the resin film of Patent Literature 3, the amount of improvement in the two properties is unsatisfactory. As for waterproof sound-permeable membranes, there is a demand for a further improvement in sound permeation properties with maintenance of high waterproofness.

An object of the present invention is to provide a waterproof gas-permeable membrane that has higher levels of both gas permeability and waterproofness than conventional ones. Another object of the present invention is to provide a waterproof sound-permeable membrane excellent in waterproofness and sound permeation properties.

Solution to Problem

A waterproof gas-permeable membrane of the present invention includes: a non-porous resin film having through holes formed to extend through the thickness of the resin film; and a liquid-repellent layer formed on a principal surface of the resin film and having openings positioned in register with the through holes. The through holes extend straight and have a diameter of 15 μm or less. The through holes are distributed at a hole density of $1 \times 10^3$ holes/cm$^2$ or more and $1 \times 10^9$ holes/cm$^2$ or less in the resin film. The resin film has the through holes that extend in oblique directions with respect to a direction perpendicular to the principal surface of the film. The obliquely-extending through holes that extend in different oblique directions are present together in the resin film.

A waterproof gas-permeable member of the present invention includes the waterproof gas-permeable membrane of the present invention and a supporting member joined to the waterproof gas-permeable membrane.

A waterproof gas-permeable structure of the present invention includes a housing having an opening; and a waterproof gas-permeable membrane placed to cover the opening, the membrane being adapted to allow passage of gas between the inside and outside of the housing and prevent water from entering the inside from the outside through the opening. The waterproof gas-permeable membrane is the waterproof gas-permeable membrane of the present invention.

A waterproof sound-permeable membrane of the present invention includes: a non-porous resin film having through holes formed to extend through the thickness of the resin film; and a liquid-repellent layer formed on a principal surface of the resin film and having openings positioned in register with the through holes. The through holes extend straight and have a diameter of 15 µm or less. The through holes are distributed at a hole density of $1 \times 10^3$ holes/cm$^2$ or more and $1 \times 10^9$ holes/cm$^2$ or less in the resin film. The resin film has the through holes that extend in oblique directions with respect to a direction perpendicular to the principal surface of the film. The obliquely-extending through holes that extend in different oblique directions are present together in the resin film.

Advantageous Effects of Invention

According to the present invention there can be obtained a waterproof gas-permeable membrane having higher levels of both gas permeability and waterproofness than conventional ones. According to the present invention there can also be obtained a waterproof sound-permeable membrane excellent in waterproofness and sound permeation properties.

DESCRIPTION OF EMBODIMENTS

Hereinafter, the present invention will be described with reference to the drawings. The present invention is not limited to the embodiments presented below.

[Waterproof Gas-Permeable Membrane]

Figure 1:
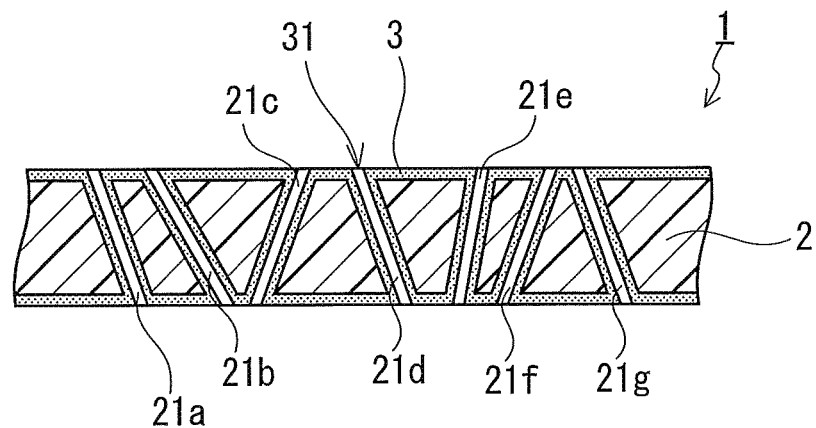
FIG. 1 is a cross-sectional view schematically showing an example of the waterproof gas-permeable membrane of the present invention.

FIG. 1 shows an example of the waterproof gas-permeable membrane of the present invention. The waterproof gas-permeable membrane 1 shown in FIG. 1 includes a non-porous resin film 2 and a liquid-repellent layer 3 formed on the principal surfaces of the resin film 2. In the resin film 2 there are formed through holes 21 (21a to 21g) extending through the thickness of the resin film 2. The liquid-repellent layer 3 has openings 31 positioned in register with the through holes 21 (positioned in register with the openings of the through holes 21 in the resin film 2). The resin film 2 is a non-porous resin film having no other routes that allow through-thickness gas permeation than the through holes 21, and is typically an imperforate (solid) resin film having no other holes than the through holes 21. The through holes 21 have openings at both of the principal surfaces of the resin film 2.

The through holes 21 extend straight; that is, they are straight holes piercing the resin film 2 straight. In this case, the through holes 21 may be holes whose diameters vary little on the way from one principal surface of the resin film 2 to the other principal surface. The through holes 21 can be formed, for example, by ion beam irradiation of a resin film serving as an original film and by chemical etching of the irradiated film. The ion beam irradiation and etching allow a large number of through holes 21 having uniform opening diameters to be formed in the resin film 2. Additionally, performing the ion beam irradiation and etching without carrying out any other step of machining or treating the film surfaces can yield a resin film 2 having surfaces which are in the same condition as those of the original film, with the exception of formation of the openings of the through holes 21. Thus, choosing, for example, an original film having highly-smooth surfaces makes it possible to obtain a resin film 21 having highly-smooth surfaces corresponding to those of the original film (e.g., a resin film 2 having surfaces which are flat with the exception of the sites of the openings). The original film is a non-porous film that, in its region used as a part of the waterproof gas-permeable membrane 1, has no routes that allow through-thickness gas permeation. The original film is typically an imperforate resin film.

The resin film 2 has the through holes 21 that extend in oblique directions with respect to a direction perpendicular to a principal surface of the film. As shown in FIG. 1, the through holes 21a to 21g extending in different oblique directions are present together in the resin film 2. In other words, the through holes 21 extend (pierce the resin film 2) in oblique directions with respect to a direction perpendicular to a principal surface of the resin film 2, and the resin film 2 has a combination of the through holes 21 that extend in different directions. The resin film 2 may have a combination of the through holes 21 that extend in the same direction. In the example shown in FIG. 1, the directions in which the through holes 21a, 21b, and 21c extend are different from each other, while the directions in which the through holes 21a, 21d, and 21g extend are the same. In the following part of the present specification, the term "set" may be used instead of "combination". The term "set" is used not only to refer to the relationship between one through hole and another through hole (a pair of through holes) but also to refer to the relationship between one or more through holes and other one or more through holes. Saying that there is a set of through holes having the same characteristics means that there are two or more through holes having the characteristics.

The resin film 2 as shown in FIG. 1 can be formed, for example, by irradiating an original film with an ion beam oblique to a direction perpendicular to a principal surface of the original film with continuous or stepwise changes in the oblique direction of the beam, and then by chemically etching the irradiated film. The ion beam is a beam of ions flying parallel to each other, which typically results in the fact that there is a set of through holes 21 that extend in the same direction in the resin film 2 (there are two or more through holes 21 that extend in the same direction in the resin film 2).

The waterproof gas-permeable membrane 1 can have higher levels of both gas permeability and waterproofness than conventional ones when the following conditions are met: the obliquely-extending through holes 21 that extend in different oblique directions are present together in the resin film 2; the through holes present in the resin film 2 have a diameter of 15 μm or less; the through holes are distributed at a density of $1\times10^3$ holes/cm$^2$ or more and $1\times10^9$ holes/cm$^2$ or less in the resin film 2; and the waterproof gas-permeable membrane 1 has the liquid-repellent layer 3 on a principal surface of the resin film 2.

Figure 2:
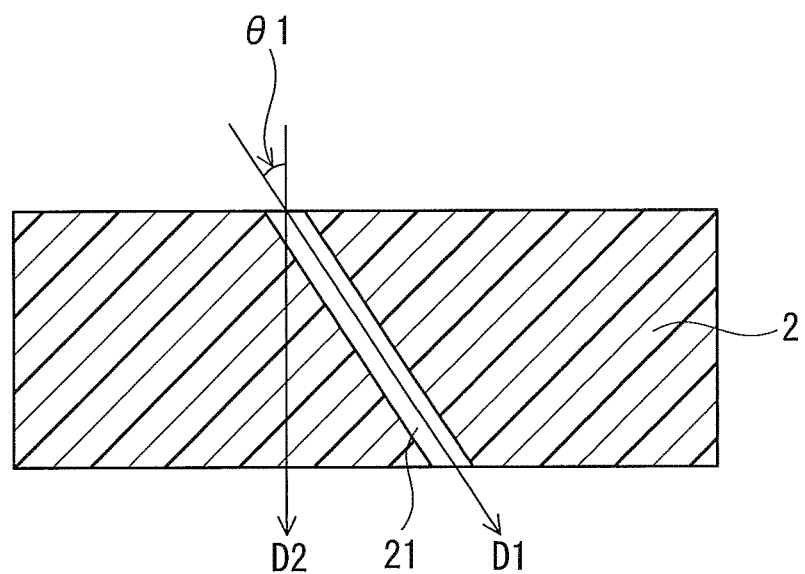
FIG. 2 is a schematic cross-sectional view for illustrating an angle θ1 formed by directions in which through holes extend obliquely with respect to a direction perpendicular to a principal surface of a resin film 2 in the waterproof gas-permeable membrane of the present invention.

The oblique direction D1 in which the through holes 21 extend forms an angle θ1 (see FIG. 2) of preferably 45° or less, more preferably 30° or less, with the direction D2 perpendicular to the principal surfaces of the resin film 2. The angle θ1 falling within the above range leads to a higher level of balance between the gas permeability and the waterproofness of the resin film 2. The lower limit of the angle θ1 is not particularly specified. The angle θ1 is, for example, 10° or more, and preferably 20° or more. An excessively large angle θ1 is likely to cause a reduction in the mechanical strength of the waterproof gas-permeable membrane 1.

The angle θ1 can be controlled, for example, by adjusting the incident angle of an ion beam to the original film in the production of the resin film 2.

In the resin film 2 there may be a set of the through holes 21 for which the values of the angle θ1 are different.

When the resin film 2 is viewed in a direction perpendicular to a principal surface of the film 2 (when the directions in which the through holes 21 extend are projected on the principal surface), the directions in which the through holes 21 extend may be parallel to each other; however, the resin film 2 preferably has a set of the through holes that extend in different directions (there are preferably the through holes 21 that extend in different directions in the resin film 2). In the latter case, a higher level of balance is achieved between the gas permeability and waterproofness of the waterproof gas-permeable membrane 1.

Figure 3:
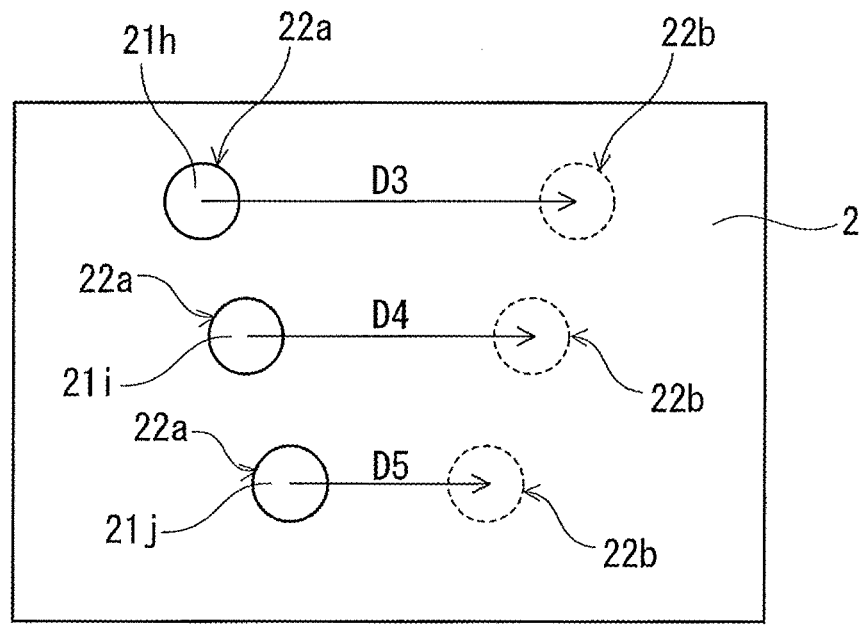
FIG. 3 is a plan view schematically showing an example of the relationship between through holes in the waterproof gas-permeable membrane of the present invention in terms of the directions in which the through holes extend.

FIG. 3 shows an example where the directions in which the through holes 21 extend when viewed in a direction perpendicular to a principal surface of the resin film 2 are parallel to each other. In the example shown in FIG. 3 there can be seen three through holes 21 (21h, 21i, and 21j). In the view taken in a direction perpendicular to a principal surface of the resin film 2, the respective directions D3, D4, and D5 in which the three through holes 21 extend (the directions from the openings 22a of the through holes 21 in the principal surface depicted on the sheet plane toward the openings 22b of the through holes 21 in the opposite principal surface) are parallel to each other (which means that θ2 discussed later is 0°). It should be recalled that the angles θ1 formed by the through holes 21h, 21i, and 21j are different from each other (the angle θ1 formed by the through hole 21j is smallest, while the angle θ1 formed by the through hole 21h is largest), and the directions in which the through holes 21h, 21i, and 21j extend are different in three dimensions.

Figure 4:
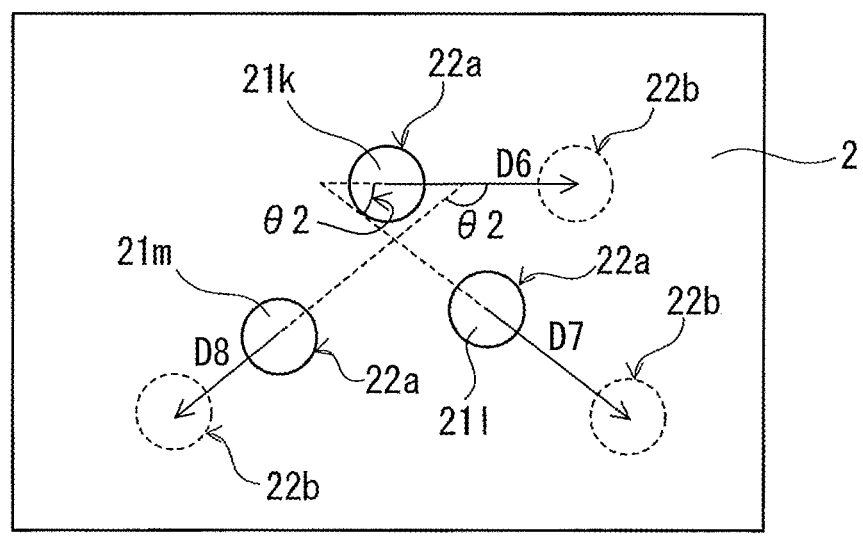
FIG. 4 is a plan view schematically showing another example of the relationship between through holes in the waterproof gas-permeable membrane of the present invention in terms of the directions in which the through holes extend.

FIG. 4 shows an example where the directions in which the through holes 21 extend when viewed in a direction perpendicular to a principal surface of the resin film 2 are different from each other. In the example shown in FIG. 4 there can be seen three through holes 21 (21k, 21l, and 21m). In the view taken in a direction perpendicular to a principal surface of the resin film 2, the respective directions D6, D7, and D8 in which the three through holes 21 extend are different from each other. When viewed in a direction perpendicular to a principal surface of the resin film 2, the through holes 21k and 21l extend from the principal surface in different directions forming an angle θ2 of less than 90°. In contrast, the through holes 21k and 21m extend from a principal surface of the resin film 2 in different directions forming an angle θ2 of not less than 90° when viewed in a direction perpendicular to the principal surface. The latter set of through holes is preferable; that is, the resin film 2 preferably has a set of the through holes 21 that, when viewed in a direction perpendicular to a principal surface of the film, extend from the principal surface in different directions forming an angle θ2 of 90° or more. In other words, the resin film 2, when viewed in a direction perpendicular to a principal surface of the film, preferably has the through hole 21k extending from the principal surface in one direction D6 and the through hole 21m extending from the principal surface in the direction D8 forming an angle θ2 of not less than 90° with the one direction D6. This leads to an even higher level of balance between the gas permeability and the waterproofness of the waterproof gas-permeable membrane 1.

Figure 5:
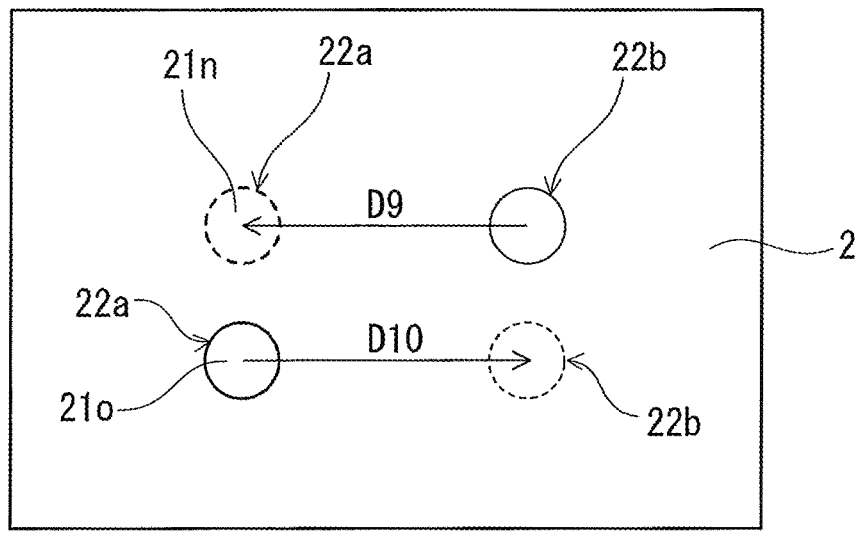
FIG. 5 is a plan view schematically showing still another example of the relationship between through holes in the waterproof gas-permeable membrane of the present invention in terms of the directions in which the through holes extend.

The angle θ2 is preferably 90° or more and 180° or less; that is, the angle θ2 may be 180°. An example where the angle θ2 is 180° is shown in FIG. 5. In the example shown in FIG. 5 there can be seen two through holes 21 (21n and 21o). When viewed in a direction perpendicular to a principal surface of the resin film 2, the through holes 21n and 21o extend in directions D9 and D10 antiparallel to each other.

Figure 6:
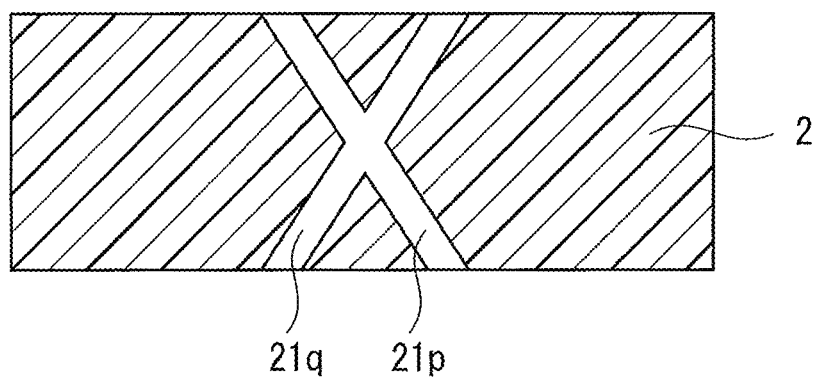
FIG. 6 is a cross-sectional view schematically showing an example of the relationship between through holes in the waterproof gas-permeable membrane of the present invention.

Two or more of the through holes 21 may cross each other within the resin film 2. That is, the resin film 2 may have a set of the through holes 21 that cross each other within the film 2. This leads to a particularly high level of balance between the gas permeability and the waterproofness of the waterproof gas-permeable membrane 1. An example of such a case is shown in FIG. 6. In the example shown in FIG. 6, through holes 21p and 21q cross each other within the resin film 2.

Figure 7:
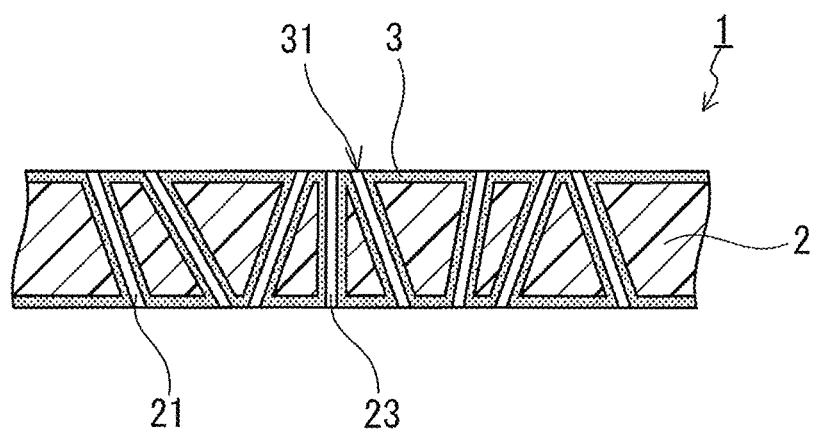
FIG. 7 is a cross-sectional view schematically showing another example of the waterproof gas-permeable membrane of the present invention.

As shown in FIG. 7, the resin film 2 may have, in addition to the through holes 21, a through hole 23 extending in a direction perpendicular to the principal surfaces of the film.

Figure 8:
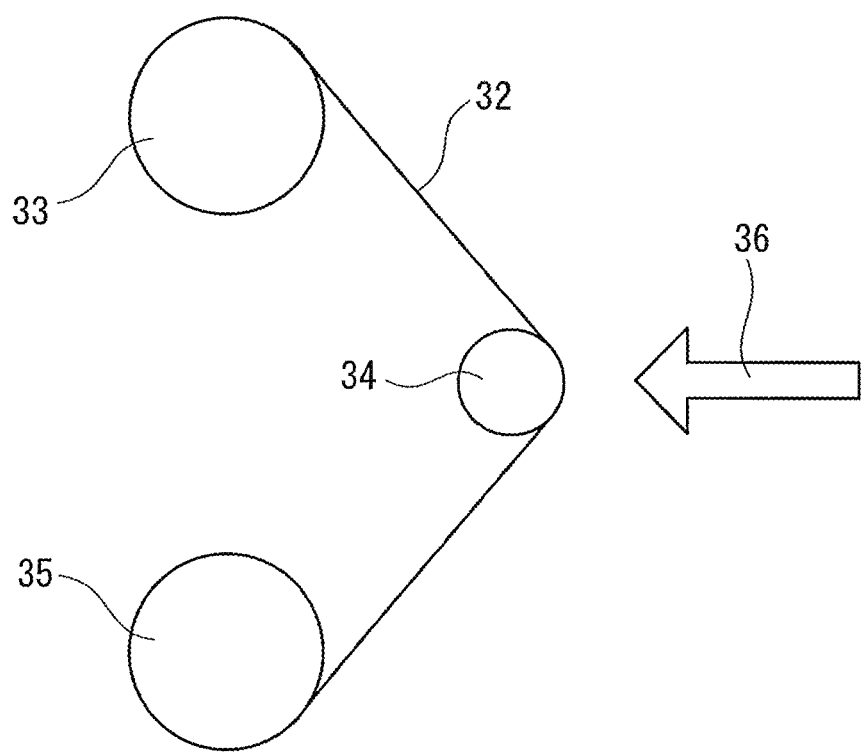
FIG. 8 is a schematic view showing an example of the method for producing the waterproof gas-permeable membrane of the present invention.

The resin film 2 as shown in FIGS. 3 to 7 can be formed, for example, with control of the direction of an ion beam applied to an original film, the timing of the application, and the cross-sectional shape of the beam line. For example, as shown in FIG. 8, a sheet-shaped original film 32 is delivered from a feed roll 33, passed through an irradiation roll 34 with a predetermined curvature, and irradiated with an ion beam 36 from a beam line with predetermined cross-sectional shape and cross-sectional area while passing through the roll 34, after which the irradiated original film 32 is wound on a take-up roll 35. During this process, the ions in the ion beam 36 which fly parallel to each other arrive at the film successively; thus, the angle of collision (incident angle θ1) of the ion beam with the principal surface of the original film 32 varies with the movement of the original film 32 on the irradiation roll 34. By chemically etching the original film thus irradiated, for example, the resin film 2 as shown in FIG. 7 is formed. In this case, the direction in which the original film is carried (MD direction) in FIG. 8 corresponds to the lateral direction in FIG. 7.

The directions in which the through holes 21 and 23 extend in the resin film 2 (in the waterproof gas-permeable membrane 1) can be known, for example, by observation of the principal surface and a cross-section of the film with a scanning electron microscope (SEM).

The shape of the openings of the through holes 21 and 23 is not particularly limited. For example, the shape may be circular or irregular.

The diameter (opening diameter) of the through holes 21 and 23 is 15 μm or less. A larger diameter of the through holes 21 and 23 leads to a reduction in the waterproofness of the waterproof gas-permeable membrane 1, which makes it difficult to achieve a good balance between the gas permeability and the waterproofness. The lower limit of the diameter of the through holes 21 and 23 is not particularly specified, and is, for example, 0.01 μm. An excessively small diameter of the through holes 21 and 23 leads to a reduction in the gas permeability of the waterproof gas-permeable membrane 1, which makes it difficult to achieve a good balance between the gas permeability and the waterproofness.

The diameter of each through hole 21 or 23 refers to the diameter of a circle, assuming that the cross-sectional shape (e.g., the shape of the opening) of the through hole 21 or 23 corresponds to the circle. The shape of the openings of the through holes 21 is typically elliptical since they extend in oblique directions with respect to a direction perpendicular to the principal surfaces of the resin film 2. It should be noted, however, that the cross-sectional shape of each through hole 21 inside the resin film 2 (the shape of a cross-section taken perpendicular to the direction in which the through hole 21 extend) can be assumed to be a circle similarly to the cross-sectional shape of the through hole 23, and the diameter of this circle is equal to the minimum diameter of the ellipse that is the shape of the opening of the through hole 21. Thus, the minimum diameter can be defined as the diameter of the through hole 21. The same can be said of the through hole 23 when the diameter of the circle is considered the minimum diameter of the shape of the opening of the through hole 23. All of the through holes 21 and 23 present in the resin film 2 need not have exactly the same diameter. In the effective portion of the resin film 2 (the portion that can be used in the waterproof gas-permeable membrane 1), however, it is preferable for the through holes 21 and 23 to have such uniform diameters that the diameters can be considered substantially equal (e.g., the standard deviation is 10% or less of the average). The diameters of the through holes 21 and 23 can be adjusted depending on the period of time for etching of the original film and/or the concentration of the etching solution. All of the through holes 21 and 23 present in the effective portion of the resin film 2 may have the same diameter.

The waterproof gas-permeable membrane 1 preferably has a through-thickness gas permeability of 0.01 cm$^3$/(cm$^2$·second) or more and 100 cm$^3$/(cm$^2$·second) or less in terms of Frazier number as measured according to JIS L 1096 (hereinafter simply referred to as "Frazier number"). Given that the liquid-repellent layer 3 has little influence on the gas permeability, the resin film 2 can have a through-thickness gas permeability of 0.01 cm$^3$/(cm$^2$·second) or more and 100 cm$^3$/(cm$^2$·second) or less in terms of Frazier number. In this case, a higher level of balance is achieved between the gas permeability and the waterproofness of the waterproof gas-permeable membrane 1. The gas permeability is preferably 2.0 cm$^3$/(cm$^2$·second) or more and 50 cm$^3$/(cm$^2$·second) or less, and more preferably 11 cm$^3$/(cm$^2$·second) or more and 50 cm$^3$/(cm$^2$·second) or less, in terms of Frazier number.

The porosity of the resin film 2 is preferably 50% or less, preferably 25% or more and 45% or less, and more preferably 30% or more and 40% or less. In this case, a higher level of balance is achieved between the gas permeability and the waterproofness of the waterproof gas-permeable membrane 1. With the use of a stretched porous membrane having a structure in which a huge number of pores formed by stretching are distributed, a waterproof gas-permeable membrane having a low porosity as specified above cannot be obtained. The resin film 2 is a non-porous film having through holes formed to extend through the thickness of the film. Thus, its porosity corresponds to the ratio of the total of the areas of the openings of the through holes 21 and 23 opening at a principal surface of the resin film 2 to the area of the principal surface.

The density of the through holes 21 and 23 (hole density) in the resin film 2 is $1 \times 10^3$ holes/cm$^2$ or more and $1 \times 10^9$ holes/cm$^2$ or less. With the hole density being below this range, the gas permeability of the waterproof gas-permeable membrane 1 is reduced. With the hole density being above this range, the waterproofness of the waterproof gas-permeable membrane 1 is reduced. The hole density is more preferably $1 \times 10^5$ holes/cm$^2$ or more and $5 \times 10^8$ holes/cm$^2$ or less. The hole density need not be constant over the entirety of the resin film 2. In the effective portion of the resin film 2, however, the hole density is preferably so uniform that the maximum hole density is 1.5 times or less the minimum hole density. The hole density can be adjusted depending on the amount of ions applied at the time of irradiation of the original film with an ion beam.

The thickness of the resin film 2 is, for example, 10 μm or more and 100 μm or less, and preferably 15 μm or more and 50 μm or less.

The material forming the resin film 2 is not particularly limited as long as the material allows the formation of the through holes 21 in an original film which is a non-porous resin film. For example, the resin film 2 is formed of a resin degradable by an alkaline solution, an acidic solution, or an alkaline or acidic solution to which has been added at least one selected from an oxidant, an organic solvent, and a surfactant. This makes easier the formation of the through holes 21 in the original film by ion beam irradiation and etching. From another aspect, the resin film 2 is formed of, for example, a resin that can be etched by hydrolysis or oxidative degradation. The resin film 2 may be formed of a resin that can be etched with an alkaline solution or an oxidant solution.

For example, the resin film 2 is formed of at least one resin selected from polyethylene terephthalate (PET), polycarbonate, polyimide, polyethylene naphthalate, and polyvinylidene fluoride.

An etching solution used in the etching for forming the through holes 21 and 23 is selected depending on the material forming the resin film 2. The etching solution is, for example, an alkaline solution, an acidic solution, or an alkaline or acidic solution to which has been added at least one selected from an oxidant, an organic solvent, and a surfactant. The etching solution can be an alkaline solution or an oxidant solution. The alkaline solution is, for example, a solution containing potassium hydroxide and/or sodium hydroxide as a main component, and may further contain an oxidant. The resin forming the original film can be hydrolyzed by the use of an alkaline solution. The oxidant solution is, for example, a solution containing as a main component at least one selected from chlorous acid, chlorite, hypochlorous acid, hypochlorite, hydrogen peroxide, and potassium permanganate. The resin forming the original film can be oxidatively degraded by the use of an oxidant solution. Examples of the combination of the etching solution and the resin forming the resin film 2 and the original film include: combinations of PET, polycarbonate, or polyethylene naphthalate with an alkaline solution (e.g., a solution containing sodium hydroxide as a main component); and combinations of polyimide or polyvinylidene fluoride with an oxidant solution (e.g., a solution containing sodium hypochlorite as a main component).

A commercially-available film can be used as the resin film 2 having the through holes 21. Such commercially-available films are sold, for example, by Oxyphen AG and Millipore Corporation as membrane filters.

The waterproof gas-permeable membrane 1 may have two or more layers of the resin film 2. Such a waterproof gas-permeable membrane 1 can be formed, for example, by ion beam irradiation and etching of a laminate having two or more layers of the original film.

The liquid-repellent layer 3 is a layer having water repellency, and preferably has oil repellency as well. The liquid-repellent layer 3 has the openings 31 positioned in register with the through holes 21 of the resin film 2. When the resin film 2 has the through hole 23, the liquid-repellent layer 3 may further have the opening 31 positioned in register with the through hole 23.

The liquid-repellent layer 3 is formed on the principal surfaces of the resin film 2. The liquid-repellent layer 3 may be formed on at least one principal surface of the resin film 2.

Such a liquid-repellent layer 3 can be formed, for example, as follows: a treatment liquid prepared by diluting a water-repellent agent or a hydrophobic oil-repellent agent with a diluent is thinly applied and dried on the resin film 2. Examples of the water-repellent agent and the hydrophobic oil-repellent agent include perfluoroalkyl acrylate and perfluoroalkyl methacrylate. The thickness of the liquid-repellent layer 3 is preferably less than ½ of the diameter of the through holes 21 (and 23).

If the liquid-repellent layer 3 is formed by thinly applying a treatment liquid onto the resin film 2, the inner circumferential surfaces of the through holes 21 (and 23) can also be, depending on the diameters of the through holes, coated with liquid-repellent layers continuous with the liquid-repellent layer 3 (such a situation is seen in the example shown in FIG. 1). In this case, the diameters of the through holes 21 (and 23) are reduced by the thicknesses of the liquid-repellent layers, as compared with their original diameters.

Figure 9:
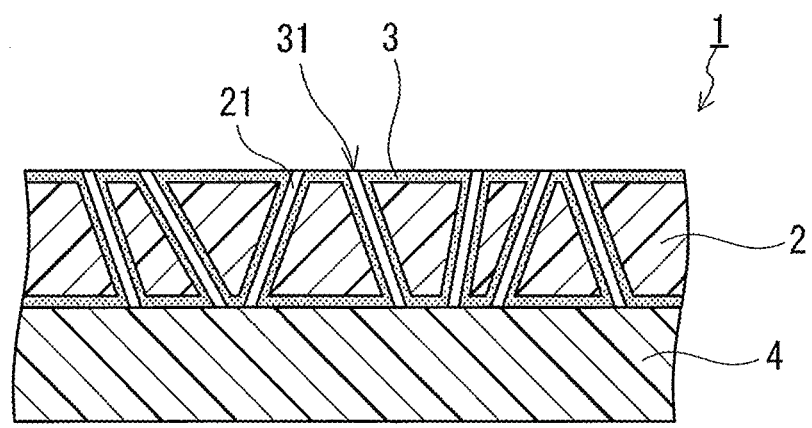
FIG. 9 is a cross-sectional view schematically showing still another example of the waterproof gas-permeable membrane of the present invention.

The waterproof gas-permeable membrane 1 may include any other member than the resin film 2 and the liquid-repellent layer 3 as long as the effect of the present invention is obtained. Such a member is, for example, a gas-permeable supporting layer 4 shown in FIG. 9. In the waterproof gas-permeable membrane 1 shown in FIG. 9, the gas-permeable supporting layer 4 is placed on one principal surface of the resin film 2 of the waterproof gas-permeable membrane 1 shown in FIG. 1. Placing the gas-permeable supporting layer 4 enhances the strength of the waterproof gas-permeable membrane 1 and improves its ease of handling.

The gas-permeable supporting layer 4 is a layer that has a higher through-thickness gas permeability than the resin film 2. As the gas-permeable supporting layer 4 there can be used, for example, a woven fabric, a non-woven fabric, a net, or a mesh. The material forming the gas-permeable supporting layer 4 is, for example, polyester, polyethylene, or aramid resin. There may be no liquid-repellent layer 3 formed on that principal surface of the resin film 2 to which the gas-permeable supporting layer 4 is placed. The shape of the gas-permeable supporting layer 4 may be the same as or different from the shape of the resin film 2. For example, the gas-permeable supporting layer 4 may have a shape adapted for placement only to the edge region of the resin film 2 (particularly a ring shape adapted for placement only to the edge region of the resin film that has a circular shape). The gas-permeable supporting layer 4 is placed, for example, by a technique such as thermal welding, or bonding by an adhesive, to the resin film 2.

The gas-permeable supporting layer 4 may be placed to one principal surface or both of the principal surfaces of the resin film 2.

The waterproof gas-permeable membrane 1 preferably has a water entry pressure of 2 kPa or more as measured according to Method B (high hydraulic pressure method) of water penetrating test specified in JIS L 1092. Having a water entry pressure of 2 kPa means being drip-proof and rainproof under daily life conditions. A water entry pressure of 5 kPa or more or even 10 kPa or more can be achieved. Having a water entry pressure of 10 kPa means being capable of withstanding the water pressure at a water depth of 1 m, which ensures waterproofness corresponding to "the degree of protection against water 7 (IPX-7)" as specified in JIS C 0920. For example, an electronic device rated as IPX-7 can avoid entry of water into the device even when accidentally dropped into water, insofar as the water depth and the duration of submergence fall within given limits. It has been empirically found that having a water entry pressure of around 5 kPa ensures waterproofness corresponding to "the degree of protection against water 4 (IPX-4)" as specified in JIS C 0920. IPX-4 is also one of the degrees of waterproofness that has recently been required of electronic devices etc. When the water entry pressure of the waterproof gas-permeable membrane 1 is 5 kPa or more or 10 kPa or more, both waterproofness corresponding to IPX-4 or IPX-7 and high gas permeability can be achieved, and it is thus possible to attain an electronic device that allows a higher flexibility in designing including aesthetic design, such as an electronic device that is less restricted in terms of the space for an opening needed by a waterproof gas-permeable structure and that can be reduced in size and/or thickness.

The surface density of the waterproof gas-permeable membrane 1 is preferably 5 to 100 g/m$^2$, and more preferably 10 to 50 g/m$^2$, in view of the strength and ease of handling of the membrane.

The thickness of the waterproof gas-permeable membrane 1 is, for example, 10 to 100 µm, and preferably 15 to 50 µm.

The waterproof gas-permeable membrane 1 may be subjected to coloring treatment. Depending on the material forming the resin film 2, the waterproof gas-permeable membrane 1 not subjected to coloring treatment is, for example, transparent or white. Such a waterproof gas-permeable membrane 1 may be conspicuous when placed to cover an opening of a housing. Such a conspicuous membrane may so stimulate the curiosity of a user as to induce the user to stab the membrane with a needle or the like, thereby impairing the function as the waterproof gas-permeable membrane. When the waterproof gas-permeable membrane 1 has been subjected to coloring treatment so that, for example, the membrane 1 has a color that is the same as or similar to the color of the housing, attraction for the user can be relatively reduced. Also, in some cases, a colored waterproof gas-permeable membrane is required in view of aesthetic design of a housing. Such an aesthetic requirement can be met by means of coloring treatment.

The coloring treatment can be carried out, for example, by dyeing the resin film 2 or by incorporating a colorant into the resin film 2. The coloring treatment may be carried out, for example, so that light in the wavelength range of 380 nm to 500 nm is absorbed. That is, the waterproof gas-permeable membrane 1 may be subjected to coloring treatment so as to be capable of absorbing light in the wavelength range of 380 nm to 500 nm. To this end, for example, the resin film 2 contains a colorant having the ability to absorb light in the wavelength range of 380 nm to 500 nm or is dyed with a dye having the ability to absorb light in the wavelength range of 380 nm to 500 nm. In this case, the waterproof gas-permeable membrane 1 can be colored blue, gray, brown, pink, green, yellow, or the like. The waterproof gas-permeable membrane 1 may be colored black, gray, brown, or pink by coloring treatment.

The waterproof gas-permeable membrane of the present invention can be used in the same applications as conventional waterproof gas-permeable membranes.

[Waterproof Sound-Permeable Membrane]

The waterproof gas-permeable membrane 1 of the present invention can be used also as a waterproof sound-permeable membrane cooperating with a housing containing audio parts such as a microphone, a speaker, and a transducer and provided with an opening for transmission of sound between the audio parts and the outside of the housing, the waterproof sound-permeable membrane being placed to cover the opening and serving to prevent water from entering the housing from outside through the opening while allowing transmission of sound between the audio parts and the outside of the housing. In this case, this waterproof sound-permeable membrane (a waterproof sound-permeable membrane of the present invention) includes: a non-porous resin film 2 having through holes 21 formed to extend through the thickness of the film; and a liquid-repellent layer 3 formed on a principal surface of the resin film 2 and having openings 31 positioned in register with the through holes 21. The through holes 21 extend straight and have a diameter (opening diameter) of 15 µm or less, the through holes 21 are distributed at a hole density of $1\times10^3$ holes/cm$^2$ or more and $1\times10^9$ holes/cm$^2$ or less in the resin film 2, the resin film 2 has the through holes 21 that extend in oblique directions with respect to a direction perpendicular to the principal surface of the film 2, and the obliquely-extending through holes 21 that extend in different oblique directions are present together in the resin film 2.

The waterproof sound-permeable membrane can have excellent waterproofness and sound permeation properties when the following conditions are met: the obliquely-extending through holes 21 that extend in different oblique directions are present together in the resin film 2; the through holes present in the resin film 2 have a diameter of 15 µm or less; the through holes are distributed at a hole density of $1\times10^3$ holes/cm$^2$ or more and $1\times10^9$ holes/cm$^2$ or less in the resin film 2; and the membrane has the liquid-repellent layer 3 on a principal surface of the resin film 2. The benefit of the membrane as a waterproof sound-permeable membrane is not necessarily associated with the benefit of the membrane as a waterproof gas-permeable membrane, that is, unprecedentedly high levels of both (high level of balance between) the gas permeability and the waterproofness. The benefit of the membrane as a waterproof sound-permeable membrane is attributed to the structure of the membrane, particularly the structure of the resin film 2. That is, a membrane including the resin film 2 having the above-specified structure and the liquid-repellent layer 3 can be used both as a waterproof gas-permeable membrane and a waterproof sound-permeable membrane which offer their respective benefits as specified above.

The resin film 2 and the liquid-repellent layer 3 included in the waterproof sound-permeable membrane of the present invention may have the same configurations as the resin film 2 and the liquid-repellent layer 3 included in the waterproof gas-permeable membrane 1 previously described. This mainly provides the effect of achieving higher waterproofness and sound permeation properties. It is more preferable for the membrane to possess the features described hereinafter, particularly given that the membrane is a sound-permeable membrane.

The upper limit of the diameter (opening diameter) of the through holes 21 and 23 is preferably 12 µm or less. The diameter of the through holes 21 and 23 is preferably 4.5 µm or more and 12 µm or less and more preferably 5 µm or more and 11 µm or less. The diameter falling within this range leads to a further improvement in the resulting sound permeation properties.

The waterproof sound-permeable membrane has a through-thickness gas permeability of preferably 5.0 cm$^3$/(cm$^2$·second) or more and 50 cm$^3$/(cm$^2$·second) or less, more preferably 11 cm$^3$/(cm$^2$·second) or more and 50 cm$^3$/(cm$^2$·second) or less, in terms of Frazier number as defined above. The through-thickness gas permeability falling within this range leads to a further improvement in the resulting sound permeation properties.

The waterproof sound-permeable membrane of the present invention has good sound permeation properties. The good sound permeation properties offer, for example, reduced "chattering noise". Increased generation of chattering noise, for example, deteriorates the quality of voice and music emitted from a speaker and the quality of voice and music received by a microphone, thus reducing the performance, function, and commercial appeal of the electronic device. The use of the waterproof sound-permeable membrane of the present invention can, for example, impart high waterproofness to an opening portion for transmission of sound to/from an audio part while reducing the generation of chattering noise caused by waterproof sound-permeable membrane placement, and thus the provision of the sound-permeable membrane to an electronic device can improve the performance, function, and commercial appeal of the electronic device.

A study by the present inventors has revealed that the chattering noise of a sound-permeable membrane can be evaluated as described below. The chattering noise is generated by the fact that passage of sound through a waterproof sound-permeable membrane induces sound having a higher frequency than the sound passing through the membrane, more particularly sound having a frequency of 5 kHz to 20 kHz. A reduction in the generation of such high-frequency induced sound leads to a reduction in the generation of the chattering noise caused by waterproof sound-permeable membrane placement.

The waterproof sound-permeable membrane of the present invention is, for example, a waterproof sound-permeable membrane having the following features: when input sound, having a sine waveform and having its sound pressure level so maintained that 1-kHz sound having passed through the membrane has a sound pressure of 94 dB, is caused to enter an effective area of 132.7 mm$^2$ of the membrane with a continuous increase in frequency of the input sound from an initial frequency of 100 Hz at a rate of 100 Hz/second, a ratio A/B of an integrated sound pressure level A over a frequency range of 100 Hz to 20 kHz to an integrated sound pressure level B over a frequency range of 5 kHz to 20 kHz is 1.16 or more as determined by FFT (fast Fourier transform) analysis for sound having passed through the membrane in 20 seconds after the start of the entry of the input sound. Such a waterproof sound-permeable membrane yields reduced generation of high-frequency induced sound and causes less chattering noise.

The reason for adjusting the sound pressure of the input sound with respect to a frequency of 1 kHz is that 1 kHz sound corresponds to standard voice of humans and is the most clearly audible sound in the audible range. In the measurement specified above, the input sound having its sound pressure level thus adjusted is caused to enter and pass through the waterproof sound-permeable membrane with a continuous change in frequency, and then FFT analysis is carried out on the sound having passed through the membrane. As the membrane having an effective area of 132.7 mm$^2$ there is assumed a waterproof sound-permeable membrane having a circular effective portion with a diameter of 6.5 mm. The effective area refers to the area of a portion (effective portion) of the waterproof sound-permeable membrane through which, when the waterproof sound-permeable membrane is placed to cover an opening of a housing, sound actually enters, travels in, and exits the membrane. For example, the effective area does not include the area of a supporting member or a bonding portion placed or formed on the edge region of the waterproof sound-permeable membrane for placement of the membrane. The effective area can typically be equal to the area of the opening over which the membrane is placed. In the case of a waterproof sound-permeable member in which a supporting member is placed on the edge region of the waterproof sound-permeable membrane, the effective area can typically be equal to the area of an opening portion of the supporting member.

The integrated sound pressure level is a value derived by integrating the sound pressure level of sound over a specified frequency range with respect to frequency. The integrated sound pressure level can be determined with a common acoustic analysis (evaluation) apparatus or acoustic analysis (evaluation) software for FFT analysis of sound.

The ratio A/B is preferably 1.16 or more and more preferably 1.25 or more. A greater ratio A/B indicates that the waterproof sound-permeable membrane yields more reduced generation of chattering noise.

The waterproof sound-permeable membrane of the present invention may further be a waterproof sound-permeable membrane having the following features: when input sound, having a sine waveform and having its sound pressure level so maintained that 1-kHz sound having passed through the membrane has a sound pressure of 94 dB, is caused to enter an effective area of 132.7 mm$^2$ of the membrane with a continuous increase in frequency of the input sound from an initial frequency of 100 Hz at a rate of 100 Hz/second, a frequency range of the input sound has a width of 1.3 kHz or less, over which a sound pressure level of 40 dB or more is observed in a 5 kHz to 20 kHz range of sound having passed through the membrane in 20 seconds after the start of the entry of the input sound. Such a membrane causes even less chattering noise. When the frequency of the input sound increased from 100 Hz reaches a frequency (defined as a minimum frequency $F_{min}$), transmitted sound is generated that contains a component belonging to a frequency range of 5 kHz to 20 kHz and having a sound pressure level of 40 dB or more. A further increase in the frequency of the input sound up to another frequency (defined as a maximum frequency $F_{max}$) extinguishes the component from the transmitted sound. A difference ΔF of 1.3 kHz or less between $F_{max}$ and $F_{min}$ indicates that the waterproof sound-permeable membrane causes even less chattering noise. It should be noted that the upper limit of $F_{max}$ is set to 2 kHz reached 20 seconds after the start of the entry of sound. ΔF is preferably 1.3 kHz or less and more preferably 1.1 kHz or less. If transmitted sound containing the above component is intermittently generated along with the increase in the frequency of the input wave from 100 Hz, the input frequency at which the component is finally extinguished from the transmitted sound is defined as $F_{max}$ (it should be noted that the upper limit of $F_{max}$ is set to 2 kHz reached 20 seconds after the start of sound input).

The waterproof sound-permeable membrane of the present invention may further be a waterproof sound-permeable membrane having the following features: when input sound, having a sine waveform and having its sound pressure level so maintained that 1-kHz sound having passed through the membrane has a sound pressure of 94 dB, is caused to enter an effective area of 132.7 mm² of the membrane with a continuous increase in frequency of the input sound from an initial frequency of 100 Hz at a rate of 100 Hz/second, the maximum frequency $F_{max}$ in a frequency range of the input sound is 1.5 kHz or less, over which frequency range a sound pressure level of 40 dB or more is observed in a 5 kHz to 20 kHz range of sound having passed through the membrane in 20 seconds after the start of the entry of the input sound. Such a waterproof sound-permeable membrane generates much smaller amount of chattering noise. The $F_{max}$ is preferably 1.5 kHz or less and more preferably 1.1 kHz or less.

[Waterproof Gas-Permeable Member and Waterproof Sound-Permeable Member]

Figure 10:
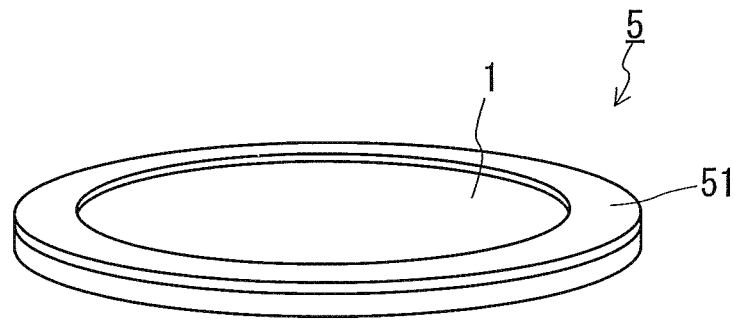
FIG. 10 is a perspective view schematically showing an example of the waterproof gas-permeable member of the present invention.

An example of the waterproof gas-permeable member of the present invention is shown in FIG. 10. The waterproof gas-permeable member 5 shown in FIG. 10 includes a waterproof gas-permeable membrane 1 that is circular in shape when viewed in a direction perpendicular to the principal surfaces of the membrane and a supporting member 51 that is a ring-shaped sheet joined to the edge region of the membrane 1. Joining the supporting member 51 to the waterproof gas-permeable membrane 1 reinforces the waterproof gas-permeable membrane 1 and improves its ease of handling. Additionally, when the waterproof gas-permeable member 5 is placed to an object such as an opening portion of a housing, the supporting member 51 can serve as a portion attached to the object and thus can make easier the attachment of the waterproof gas-permeable membrane 1.

Figure 11:
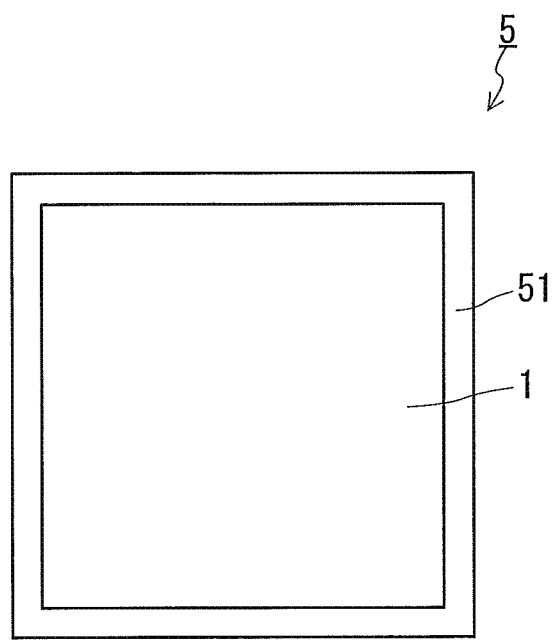
FIG. 11 is a plan view schematically showing another example of the waterproof gas-permeable member of the present invention.

The shape of the supporting member 51 is not limited. For example, as shown in FIG. 11, the supporting member 51 may be a frame-shaped sheet joined to the edge region of the waterproof gas-permeable membrane 1 that is rectangular in shape when viewed in a direction perpendicular to the principal surfaces of the membrane. By conforming the shape of the supporting member 51 to the shape of the edge region of the waterproof gas-permeable membrane 1 as shown in FIGS. 10 and 11, the decline in gas permeability of the waterproof gas-permeable membrane 1 caused by placement of the supporting member 51 is reduced. It is preferable for the supporting member 51 to be in the form of a sheet, from the viewpoint of ease of handling of the waterproof gas-permeable member 5 and ease of placement to a housing, particularly ease of placement inside the housing. In the examples shown in FIGS. 10 and 11, the waterproof gas-permeable membrane 1 is exposed (both surfaces of the waterproof gas-permeable membrane 1 are exposed), with the exception of the edge region on which the supporting member 51 is placed.

The material forming the supporting member 51 is, for example, a resin, a metal, or a composite thereof. Examples of the resin include: polyolefins such as polyethylene and polypropylene; polyesters such as PET and polycarbonate; polyimides; and a composite thereof. Examples of the metal include metals having excellent corrosion resistance, such as stainless steel and aluminum.

The thickness of the supporting member 51 is, for example, 5 to 500 μm, and preferably 25 to 200 μm. In particular, in view of its function as the portion for attachment, the ring width (or frame width: the difference between the outer size and inner size) is suitably about 0.5 to 2 mm. A foamed material made of any of the above-mentioned resins may be used as the supporting member 51.

The method for joining the waterproof gas-permeable membrane 1 and the supporting member 51 together is not particularly limited. For example, techniques such as heat welding, ultrasonic welding, bonding by an adhesive, and bonding by a double-faced tape, can be employed.

The waterproof gas-permeable member 5 may include two or more waterproof gas-permeable membranes 1 and/or two or more supporting members 51.

The waterproof gas-permeable member of the present invention can be used in the same applications as conventional waterproof gas-permeable members. Additionally, the waterproof gas-permeable member of the present invention can be used as a waterproof sound-permeable member in which the waterproof gas-permeable membrane serves as a waterproof sound-permeable membrane. In this case, this waterproof sound-permeable member includes the waterproof gas-permeable membrane (sound-permeable membrane) of the present invention and a supporting member joined to the waterproof gas-permeable membrane (sound-permeable membrane). The configuration of the supporting member may be the same as the configuration of the supporting member 51 of the waterproof gas-permeable member.

[Waterproof Gas-Permeable Structure and Waterproof Sound-Permeable Structure]

Figure 12:
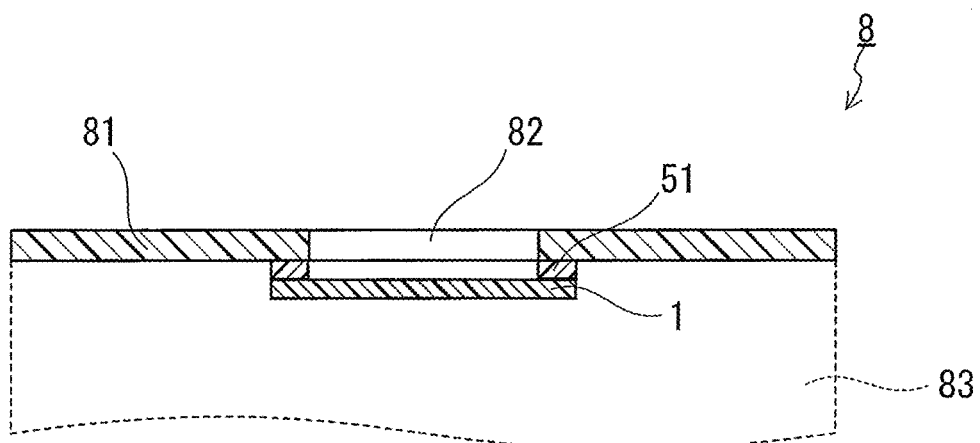
FIG. 12 is a cross-sectional view schematically showing an example of the waterproof gas-permeable structure of the present invention.

An example of the waterproof gas-permeable structure of the present invention is shown in FIG. 12. The waterproof gas-permeable structure 8 shown in FIG. 12 includes: a housing 81 provided with an opening (opening portion) 82 for allowing passage of gas between an interior 83 and the outside of the housing; and the waterproof gas-permeable membrane 1 placed to cover the opening 82. The opening 82 is a space making connection between the inside and outside of the housing 81, and gas can move between the inside and outside of the housing 81 through the opening. The waterproof gas-permeable membrane 1 can prevent water from entering the housing 81 from outside through the opening 82 while allowing passage of gas between the outside and the interior 83 of the housing 81. In the example shown in FIG. 12, the waterproof gas-permeable membrane 1 is joined to the housing 81 via the supporting member 51. In other words, the waterproof gas-permeable member including the waterproof gas-permeable membrane 1 and the supporting member 51 is joined to the housing 81. In the example shown in FIG. 12, the waterproof gas-permeable membrane 1 is joined to the housing 81 within the interior 83 of the housing 81; however, the waterproof gas-permeable membrane 1 may be joined to the exterior of the housing 81.

The housing 81 is formed of a resin, a metal, glass, or a composite thereof.

For the placement of the waterproof gas-permeable membrane 1, techniques such as adhesion using a double-faced tape, thermal welding, high-frequency welding, and ultrasonic welding, can be employed. The supporting member 51 may be the double-faced tape.

A component, device, equipment, product or the like that can have the waterproof gas-permeable structure 8 is not limited.

The waterproof gas-permeable structure of the present invention can be used in a variety of applications similarly to conventional waterproof gas-permeable structures. Additionally, the waterproof gas-permeable structure of the present invention can be used as a waterproof sound-permeable structure in which the waterproof gas-permeable membrane serves as a waterproof sound-permeable membrane. In this case, this waterproof sound-permeable structure includes a housing provided with an opening for transmission of sound between the inside and outside of the housing; and a waterproof sound-permeable membrane placed to cover the opening, the membrane being adapted to allow transmission of sound between the inside and outside of the housing and prevent water from entering the inside of the housing from the outside through the opening, the membrane being the above waterproof gas-permeable membrane (sound-permeable membrane) of the present invention. The configuration of the housing, the joining of the waterproof sound-permeable membrane to the housing, etc., may be the same as those for the waterproof gas-permeable structure.

An example using the waterproof gas-permeable structure of the present invention as a waterproof sound-permeable structure is an electronic device. More specifically, this electronic device includes: a housing containing an audio part and provided with an opening for transmission of sound between the audio part and the outside of the housing; and a waterproof sound-permeable membrane placed to cover the opening, the membrane being adapted to allow transmission of sound between the audio part and the outside of the housing and prevent water from entering the housing from the outside through the opening, the membrane being the above waterproof gas-permeable membrane (sound-permeable membrane) of the present invention.

Figure 13A:
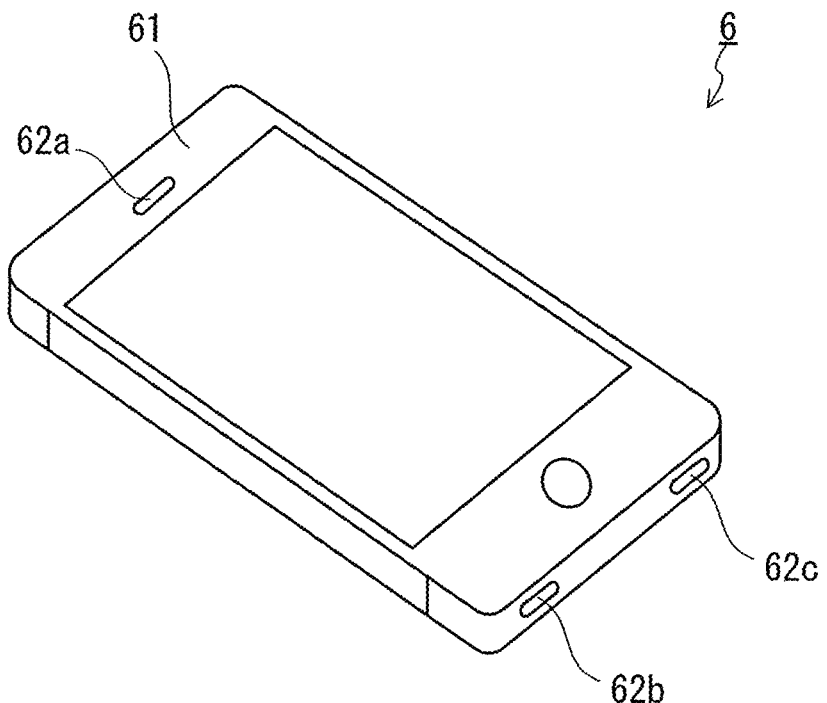
FIG. 13A is a perspective view schematically showing an example of an electronic device including the waterproof sound-permeable membrane of the present invention.
Figure 13B:
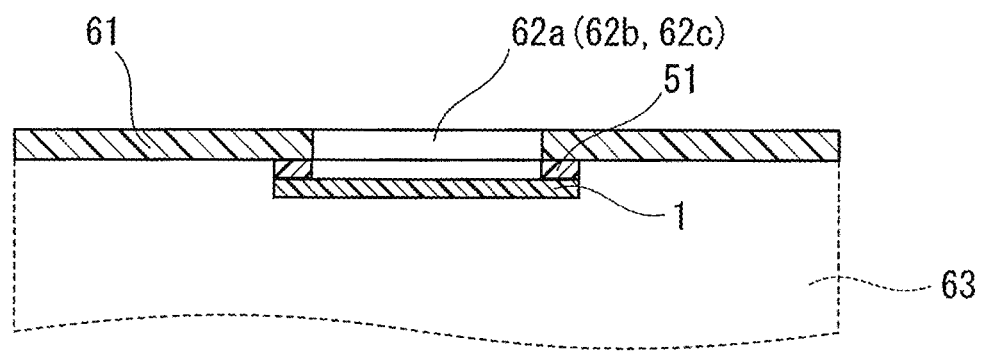
FIG. 13B is a cross-sectional view schematically showing the placement of the waterproof sound-permeable membrane in the electronic device of FIG. 13A.

An example of the electronic device is shown in FIG. 13A. The electronic device shown in FIG. 13A is a smartphone which is a type of mobile phone. A housing 61 of the smartphone 6 has an opening 62a provided in proximity to a transducer which is a type of sound emitting-receiving device, an opening 62b provided in proximity to a microphone which is a type of sound receiver, and an opening 62c provided in proximity to a speaker which is a type of sound emitter. Sound is transmitted through the openings 62a to 62c between the outside of the smartphone 6 and the audio parts (transducer, microphone, and speaker) contained in the housing 61. In the smartphone 6, as shown in FIG. 13B, the waterproof gas-permeable membranes (sound-permeable membranes) 1 are attached inside the housing 61 to cover these openings 62a to 62c. It is thus possible to allow transmission of sound between the outside of the smartphone 6 and the audio parts and also possible to prevent water from entering the housing 61 from the outside through the openings.

The location and method for placing the waterproof gas-permeable membranes (sound-permeable membranes) 1 in the electronic device 6 are not limited, as long as the openings (opening portions) provided in the housing 61 of the device 6 are covered by the membranes. In the example shown in FIG. 13B, the joining of the waterproof gas-permeable membrane (sound-permeable membrane) 1 to the housing 61 is done via the supporting member 51 (that is, a waterproof gas-permeable member (sound-permeable member) is joined to the housing). For the placement of the waterproof gas-permeable membrane (sound-permeable membrane) 1 inside the electronic device 6, techniques such as adhesion using a double-faced tape, thermal welding, high-frequency welding, and ultrasonic welding, can be employed. The supporting member 51 may be the double-faced tape.

The housing 61 is formed of a resin, a metal, glass, or a composite thereof. As in smartphones and tablet computers, the display screen of the electronic device 6 may constitute a part of the housing 61.

The electronic device is not limited to the smartphone 6. Electronic devices that fall under the category of the electronic device of the present invention include all types of electronic devices that are equipped with an audio part, that have a housing provided with an opening for transmission of sound between the outside of the housing and the audio part, that require prevention of entry of water into the housing through the opening, and that allow the waterproof gas-permeable membrane (sound-permeable membrane) 1 to be placed to cover the opening. Examples of the electronic devices include: mobile phones such as feature phones and smartphones; mobile computers such as tablet computers, wearable computers, PDAs, video game equipments, and notebook computers; electronic notebooks; digital cameras; video cameras; and electronic book readers.

It is naturally possible, without sound permeability in mind, to envisage an electronic device having the waterproof gas-permeable structure simply for the purpose of ensuring gas permeability and waterproofness. Such an electronic device includes: a housing having an opening; and a waterproof gas-permeable membrane placed to cover the opening, the membrane being adapted to allow passage of gas between the inside and outside of the housing and prevent water from entering the inside from the outside through the opening. This waterproof gas-permeable membrane is the waterproof gas-permeable membrane of the present invention.

Another example using the waterproof gas-permeable structure of the present invention as a waterproof sound-permeable structure is an electronic device case. More specifically, this electronic device case is a case for containing an electronic device having an audio part and includes: an opening provided to allow transmission of sound between the audio part of the electronic device and the outside of the case; and a waterproof sound-permeable membrane placed to cover the opening, the membrane being adapted to allow transmission of sound between the audio part of the electronic device and the outside of the case and prevent water from entering the case from the outside through the opening, the membrane being the above waterproof gas-permeable membrane (sound-permeable membrane) of the present invention.

Figure 14A:
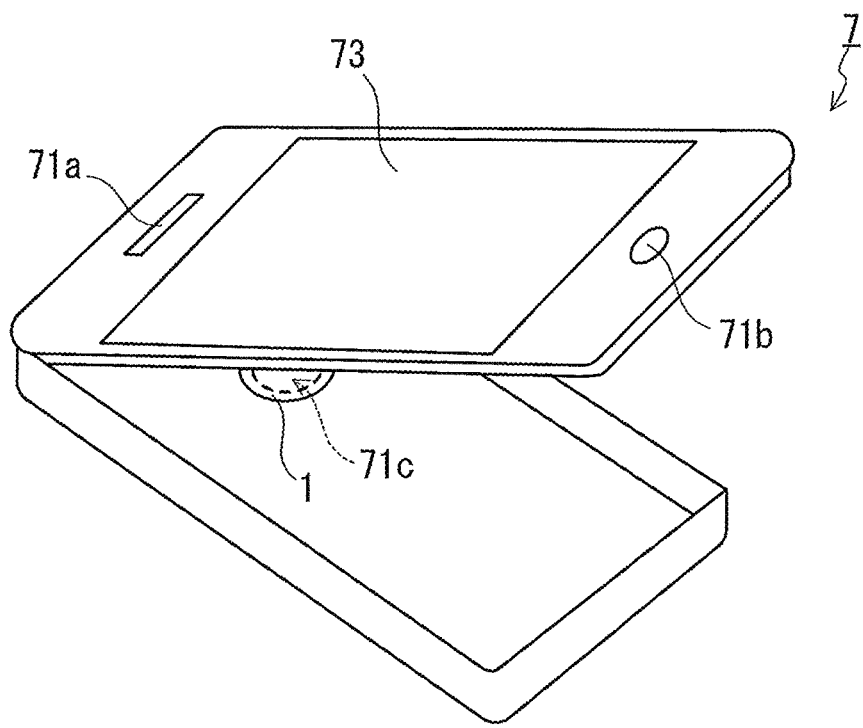
FIG. 14A is a perspective view schematically showing an example of an electronic device case including the waterproof sound-permeable membrane of the present invention.
Figure 14B:
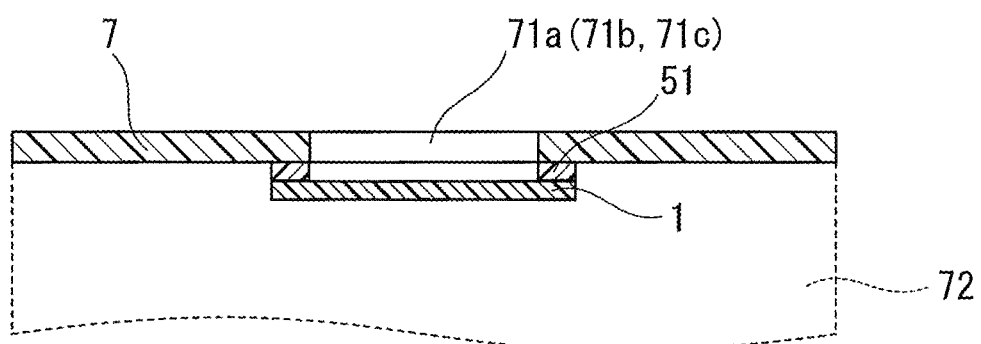
FIG. 14B is a cross-sectional view schematically showing the placement of the waterproof sound-permeable membrane in the electronic device case of FIG. 14A.

An example of the electronic device case is shown in FIG. 14A. The case 7 shown in FIG. 14A is provided with openings 71a to 71c for allowing transmission of sound between audio parts of the electronic device contained in the case 7 and the outside of the case 7. The case 7 shown in FIG. 14A is a case of a smartphone that is different in type from the smartphone 6 shown in FIG. 13A. The opening 71a is provided for transmission of sound from the voice receiver of the smartphone, the opening 71b is provided for transmission of sound to the voice transmitter of the smartphone, and the opening 71c is provided for transmission of sound from the speaker of the smartphone to the outside. As shown in FIG. 14B, the case 7 further includes the waterproof gas-permeable membrane (sound-permeable membrane) 1 placed to cover the opening 71a (71b, 71c). This membrane allows transmission of sound between the outside of the case 7 and the audio part of the electronic device contained in an interior 72 of the case 7, and also can prevent water from entering the interior 72 of the case 7, and then the electronic device, from the outside through the opening 71a (71b, 71c).

The method for placing the waterproof gas-permeable membrane (sound-permeable membrane) 1 in the electronic device case 7 is not limited, as long as the opening (opening portion) 71a (71b, 71c) is covered by the membrane 1. In the example shown in FIG. 14B, the joining of the waterproof gas-permeable membrane (sound-permeable membrane) 1 to the case 7 is done within the interior 72 via the supporting member 51 (that is, a waterproof gas-permeable member (sound-permeable member) is joined to the case). For the placement of the waterproof gas-permeable membrane (sound-permeable membrane) 1 to the case 7, techniques such as adhesion using a double-faced tape, thermal welding, high-frequency welding, and ultrasonic welding, can be employed. The supporting member 51 may be the double-faced tape. The waterproof gas-permeable membrane (sound-permeable membrane) 1 may be placed on the exterior of the case 7.

The electronic device case 7 is formed of a resin, a metal, glass, or a composite thereof. The electronic device case 7 may have any structure as long as the effects of the present invention are obtained. For example, the case 7 shown in FIG. 14A is a case for a smartphone, and includes a film 73 that allows external operation of a touch panel of the smartphone contained in the case.

It is naturally possible, without sound permeability in mind, to envisage an electronic device case having the waterproof gas-permeable structure simply for the purpose of ensuring gas permeability and waterproofness. This electronic device case has an opening and includes a waterproof gas-permeable membrane placed to cover the opening, the membrane being adapted to allow passage of gas between the inside and outside of the case and prevent water from entering the inside from the outside through the opening. This waterproof gas-permeable membrane is the waterproof gas-permeable membrane of the present invention.

EXAMPLES

The present invention will now be described in more detail by way of examples. The present invention is not limited to the examples presented below.

Methods of evaluation of resin films and waterproof gas-permeable membranes prepared in Examples and Comparative Examples will first be described.

[Diameter of Through Holes]

Both principal surfaces of each resin film were observed with a scanning electron microscope (SEM), 10 through holes were arbitrarily selected from those captured in the obtained SEM images, and the diameters (opening diameters) of the selected through holes were determined based on the images. The average of the diameters was determined as the diameter of the through holes of the resin film.

[Gas Permeability]

The through-thickness gas permeability of each waterproof gas-permeable membrane was determined according to JIS L 1096 (Method A of gas permeability measurement: Frazier method).

[Water Entry Pressure]

The water entry pressure of each waterproof gas-permeable membrane was determined according to Method B (high hydraulic pressure method) of water penetrating test specified in JIS L 1092. When a test piece of the membrane has an area specified in this standard, the membrane undergoes a significant change in shape. Thus, in order to reduce the change in shape of the membrane to some extent, a stainless steel mesh (opening diameter=2 mm) was placed on one side of the membrane opposite to its surface subjected to pressure, and in this state the measurement was performed.

[Hole Density]

The hole density of each resin film was determined by observing both principal surfaces of the resin film with a SEM, visually counting the number of the through holes captured in the obtained SEM images, and dividing the counted number to calculate the number per unit area.

[Oil Repellency]

The oil repellency of each waterproof gas-permeable membrane was evaluated by the procedures described hereinafter. The waterproof gas-permeable membrane and a sheet of copy paper (regular paper) were stacked in such a manner that the waterproof gas-permeable membrane formed an upper layer and the sheet of copy paper formed an under layer. A drop of castor oil was applied to the waterproof gas-permeable membrane with a dropper, and the stack was then left for 1 minute. The waterproof gas-permeable membrane was then removed, and the condition of the sheet of copy paper was checked. In the case where the sheet of copy paper was wet with the castor oil, the waterproof gas-permeable membrane was determined to lack oil repellency, while in the case where the sheet of copy paper was not wet, the waterproof gas-permeable membrane was determined to possess oil repellency.

Example 1

There was prepared a commercially-available non-porous PET film (Track-etched membrane manufactured by it4ip and having a thickness of 44 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes were straight holes having a diameter of 6.5 μm; (2) both through holes extending in oblique directions with respect to a principal surface of the film and through holes extending in a direction perpendicular to the principal surface are present together in the film; (3) the directions of all of the through holes extending obliquely to the principal surface of the film form an angle $\theta 1$ of 30° or less with the direction perpendicular to the principal surface; (4) the obliquely-extending through holes include both a group of obliquely-extending through holes extending in one direction when viewed in the direction perpendicular to the principal surface of the film and a group of obliquely-extending through holes extending in a direction opposite to the one direction (a group of through holes forming an angle $\theta 2$ of 180°); and (5) there were a number of sets of through holes crossing each other within the film. The hole density of the film was $1.8 \times 10^6$ holes/cm².

Next, a liquid-repellent treatment solution was applied to all the surfaces, including the upper and lower surfaces, of this film, and then left to dry at ordinary temperature for 30 minutes to form a liquid-repellent layer over the surfaces of the film, thus obtaining a waterproof gas-permeable membrane. The liquid-repellent treatment solution was prepared by diluting a liquid-repellent agent (X-70-029C, manufactured by Shin-Etsu Chemical Co., Ltd.) with a diluent (FS thinner, manufactured by Shin-Etsu Chemical Co., Ltd.) to a concentration of 0.7 weight %.

The waterproof gas-permeable membrane thus obtained had a gas permeability (Frazier number) of 18.5 cm³/(cm²·second) and a water entry pressure of 15 kPa, and "possessed" oil repellency.

Comparative Example 1

There was prepared a commercially-available non-porous PET film (Track-etched membrane manufactured by it4ip and having a thickness of 44 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes were straight holes having a diameter of 6.5 μm; and (2) the through holes present in the film were only those that extended in a direction perpendicular to a principal surface of the film. The hole density of the film was $1.8 \times 10^6$ holes/cm² as in the Example.

Next, a liquid-repellent treatment solution was applied to all the surfaces, including the upper and lower surfaces, of this film, and then left to dry at ordinary temperature for 30 minutes to form a liquid-repellent layer over the surfaces of the film, thus obtaining a waterproof gas-permeable membrane. The liquid-repellent treatment solution was prepared by diluting a liquid-repellent agent (X-70-029C, manufactured by Shin-Etsu Chemical Co., Ltd.) with a diluent (FS thinner, manufactured by Shin-Etsu Chemical Co., Ltd.) to a concentration of 0.7 weight %.

The waterproof gas-permeable membrane thus obtained had a gas permeability (Frazier number) of 17.1 cm³/(cm²·second) and a water entry pressure of 9 kPa, and "possessed" oil repellency.

The waterproof gas-permeable membrane of Example 1 was superior in both gas permeability and water entry pressure to that of Comparative Example 1.

Example 2

There was prepared a commercially-available non-porous PET film (Track-etched membrane manufactured by it4ip and having a thickness of 44 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes were straight holes having a diameter of 5.5 μm; (2) both through holes extending in oblique directions with respect to a principal surface of the film and through holes extending in a direction perpendicular to the principal surface are present together in the film; (3) the directions of all of the through holes extending obliquely to the principal surface of the film form an angle θ1 of 30° or less with the direction perpendicular to the principal surface; (4) the obliquely-extending through holes include both a group of obliquely-extending through holes extending in one direction when viewed in the direction perpendicular to the principal surface of the film and a group of obliquely-extending through holes extending in a direction opposite to the one direction (a group of through holes forming an angle θ2 of 180°); and (5) there were a number of sets of through holes crossing each other within the film. The hole density of the film was $1.8 \times 10^6$ holes/cm².

Next, a liquid-repellent treatment solution was applied to all the surfaces, including the upper and lower surfaces, of this film, and then left to dry at ordinary temperature for 30 minutes to form a liquid-repellent layer over the surfaces of the film, thus obtaining a waterproof gas-permeable membrane. The liquid-repellent treatment solution was prepared by diluting a liquid-repellent agent (X-70-029C, manufactured by Shin-Etsu Chemical Co., Ltd.) with a diluent (FS thinner, manufactured by Shin-Etsu Chemical Co., Ltd.) to a concentration of 0.7 weight %.

The waterproof gas-permeable membrane thus obtained had a gas permeability (Frazier number) of 8.0 cm³/(cm²·second) and a water entry pressure of 18 kPa, and "possessed" oil repellency.

Comparative Example 2

There was prepared a commercially-available non-porous PET film (Track-etched membrane manufactured by it4ip and having a thickness of 44 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes were straight holes having a diameter of 5.5 μm; and (2) the through holes present in the film were only those that extended in a direction perpendicular to a principal surface of the film. The hole density of the film was $1.8 \times 10^6$ holes/cm² as in the Example.

Next, a liquid-repellent treatment solution was applied to all the surfaces, including the upper and lower surfaces, of this film, and then left to dry at ordinary temperature for 30 minutes to form a liquid-repellent layer over the surfaces of the film, thus obtaining a waterproof gas-permeable membrane. The liquid-repellent treatment solution was prepared by diluting a liquid-repellent agent (X-70-029C, manufactured by Shin-Etsu Chemical Co., Ltd.) with a diluent (FS thinner, manufactured by Shin-Etsu Chemical Co., Ltd.) to a concentration of 0.7 weight %.

The waterproof gas-permeable membrane thus obtained had a gas permeability (Frazier number) of 5.0 cm³/(cm²·second) and a water entry pressure of 11 kPa, and "possessed" oil repellency.

The waterproof gas-permeable membrane of Example 2 was superior in both gas permeability and water entry pressure to that of Comparative Example 2.

Example 3

There was prepared a commercially-available non-porous PET film (Track-etched membrane manufactured by it4ip and having a thickness of 44 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes were straight holes having a diameter of 5.9 μm; (2) both through holes extending in oblique directions with respect to a principal surface of the film and through holes extending in a direction perpendicular to the principal surface are present together in the film; (3) the directions of all of the through holes extending obliquely to the principal surface of the film form an angle θ1 of 30° or less with the direction perpendicular to the principal surface; (4) the obliquely-extending through holes include both a group of obliquely-extending through holes extending in one direction when viewed in the direction perpendicular to the principal surface of the film and a group of obliquely-extending through holes extending in a direction opposite to the one direction (a group of through holes forming an angle θ2 of 180°); and (5) there were a number of sets of through holes crossing each other within the film. The hole density of the film was $2.0 \times 10^6$ holes/cm².

Next, a liquid-repellent treatment solution was applied to all the surfaces, including the upper and lower surfaces, of this film, and then left to dry at ordinary temperature for 30 minutes to form a liquid-repellent layer over the surfaces of the film, thus obtaining a waterproof gas-permeable membrane. The liquid-repellent treatment solution was prepared by diluting a liquid-repellent agent (X-70-029C, manufactured by Shin-Etsu Chemical Co., Ltd.) with a diluent (FS thinner; manufactured by Shin-Etsu Chemical Co., Ltd.) to a concentration of 0.7 weight %.

The waterproof gas-permeable membrane thus obtained had a gas permeability (Frazier number) of 25.0 cm$^3$/(cm$^2$·second) and a water entry pressure of 17 kPa, and "possessed" oil repellency.

Comparative Example 3

There was prepared a commercially-available non-porous PET film (Track-etched membrane manufactured by it4ip and having a thickness of 44 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes were straight holes having a diameter of 5.9 μm; and (2) the through holes present in the film were only those that extended in a direction perpendicular to a principal surface of the film. The hole density of the film was 2.0×10$^6$ holes/cm$^2$ as in the Example.

Next, a liquid-repellent treatment solution was applied to all the surfaces, including the upper and lower surfaces, of this film, and then left to dry at ordinary temperature for 30 minutes to form a liquid-repellent layer over the surfaces of the film, thus obtaining a waterproof gas-permeable membrane. The liquid-repellent treatment solution was prepared by diluting a liquid-repellent agent (X-70-029C, manufactured by Shin-Etsu Chemical Co., Ltd.) with a diluent (FS thinner, manufactured by Shin-Etsu Chemical Co., Ltd.) to a concentration of 0.7 weight %.

The waterproof gas-permeable membrane thus obtained had a gas permeability (Frazier number) of 14.5 cm$^3$/(cm$^2$·second) and a water entry pressure of 10 kPa, and "possessed" oil repellency.

The waterproof gas-permeable membrane of Example 3 was superior in both gas permeability and water entry pressure to that of Comparative Example 3.

Example 4

There was prepared a commercially-available non-porous PET film (Track-etched membrane manufactured by it4ip and having a thickness of 44 μm) having through holes formed to extend through the thickness of the film. This film is one produced by irradiating an imperforate PET film with an ion beam and chemically etching the irradiated film. SEM observation of the surfaces and a cross-section of this film confirmed that: (1) the through holes were straight holes having a diameter of 10.0 μm; (2) both through holes extending in oblique directions with respect to a principal surface of the film and through holes extending in a direction perpendicular to the principal surface are present together in the film; (3) the directions of all of the through holes extending obliquely to the principal surface of the film form an angle θ1 of 30° or less with the direction perpendicular to the principal surface; (4) the obliquely-extending through holes include both a group of obliquely-extending through holes extending in one direction when viewed in the direction perpendicular to the principal surface of the film and a group of obliquely-extending through holes extending in a direction opposite to the one direction (a group of through holes forming an angle θ2 of 180°); and (5) there were a number of sets of through holes crossing each other within the film. The hole density of the film was 5.0×10$^5$ holes/cm$^2$.

Next, a liquid-repellent treatment solution was applied to all the surfaces, including the upper and lower surfaces, of this film, and then left to dry at ordinary temperature for 30 minutes to form a liquid-repellent layer over the surfaces of the film, thus obtaining a waterproof gas-permeable membrane. The liquid-repellent treatment solution was prepared by diluting a liquid-repellent agent (X-70-029C, manufactured by Shin-Etsu Chemical Co., Ltd.) with a diluent (FS thinner, manufactured by Shin-Etsu Chemical Co., Ltd.) to a concentration of 0.7 weight %.

The waterproof gas-permeable membrane thus obtained had a gas permeability (Frazier number) of 50.0 cm$^3$/(cm$^2$·second) and a water entry pressure of 6 kPa, and "possessed" oil repellency.

The above results are collectively shown in Table 1 below.

TABLE 1

| | Hole density [holes/cm$^2$] | Opening diameter [μm] | Gas permeability [cm$^3$/(cm$^2$·sec)] | Water entry pressure [kPa] | Oil repellency |
|---|---|---|---|---|---|
| Example 1 | 1.8 × 10$^6$ | 6.5 | 18.5 | 15 | Possessed |
| Comp. Example 1 | 1.8 × 10$^6$ | 6.5 | 17.1 | 9 | Possessed |
| Example 2 | 1.8 × 10$^6$ | 5.5 | 8.0 | 18 | Possessed |
| Comp. Example 2 | 1.8 × 10$^6$ | 5.5 | 5.0 | 11 | Possessed |
| Example 3 | 2.0 × 10$^6$ | 5.9 | 25.0 | 17 | Possessed |
| Comp. Example 3 | 2.0 × 10$^6$ | 5.9 | 14.5 | 10 | Possessed |
| Example 4 | 5.0 × 10$^5$ | 10.0 | 50.0 | 6 | Possessed |

Next, with the use as waterproof sound-permeable membranes in mind, the waterproof gas-permeable membranes of Examples 2 to 4 and Comparative Example 2 were evaluated for their sound permeation properties by the procedures described hereinafter.

Figure 15:
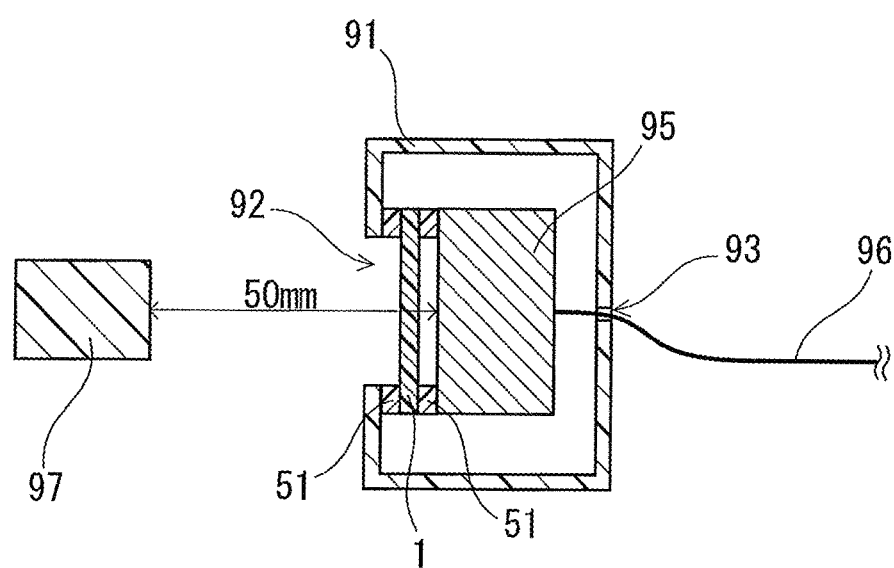
FIG. 15 is a cross-sectional view schematically showing: the configuration of a simulant housing used to evaluate the sound permeation properties of waterproof sound-permeable membranes in examples; and the arrangement of a speaker, a waterproof sound-permeable membrane, and a microphone.

A simulant housing 91 (made of polystyrene and having outer dimensions of 60 mm×50 mm×28 mm) imitating a housing of a mobile phone was prepared first as shown in FIG. 15. The simulant housing 91 was provided with one speaker attachment hole 92 (having the shape of a 13-mm-diameter circle) serving as an opening for allowing transmission of sound emitted from a speaker to the outside of the housing and with one guide hole 93 for a speaker cable 96. The housing 91 had no other openings than these holes.

Next, a double-faced tape (No. 5620A, manufactured by NITTO DENKO CORPORATION and having a thickness of 0.2 mm) was prepared, and ring-shaped pieces each having an inner diameter of 13 mm and an outer diameter of 16 mm were punched from this tape, thus preparing ring-shaped supporting members 51. Additionally, a circular piece having a diameter of 16 mm was punched from each of the waterproof gas-permeable membranes 1 (waterproof sound-permeable membranes) prepared in Examples 2 to 4 and Comparative Example 2. Next, one supporting member 51, the circular piece of the waterproof gas-permeable membrane 1, and another supporting member 51 were stacked in this order in such a manner that their outer peripheries entirely overlapped each other. In this manner, samples for evaluation of sound permeation properties were obtained. The sound-permeable membranes as samples had an effective area of 132.7 mm$^2$ (corresponding to the area of a 13-mm-diameter circle).

Next, as shown in FIG. 15, each of the prepared samples was attached inside the speaker attachment hole 92 of the simulant housing 91 by means of one of the supporting members (double-faced tapes) 51. This was done so that the effective portion of the sound-permeable membrane as the sample fully overlapped the opening of the speaker attachment hole 92. Then, as shown in FIG. 15, a speaker 95 (SCG-16A, manufactured by STAR MICRONICS CO., LTD and having an outer shape of a 16-mm-diameter circle) was further attached by means of the other supporting member (double-faced tape) 51 of the sample. This was done so that the outer periphery of the speaker fully overlapped the outer periphery of the sample. The speaker cable 96 of the speaker 95 was led to the outside of the housing 91 through the guide hole 93, and then the guide hole 93 was closed with a putty.

Next, the speaker cable 96 and a microphone 97 (Type 2669, manufactured by Bruel & Kjaer Sound & Vibration Measurement A/S (B&K)) were connected to an acoustic evaluation apparatus (Multi-analyzer System 3560-B-030, manufactured by B&K), and the microphone 97 was placed at a distance of 50 mm from the front surface of the speaker 95 contained in the simulant housing 91. Then, FFT analysis (test signals of 100 Hz to 20 kHz, sweep) was selected as the evaluation mode, and carried out to evaluate the sound permeation properties (the sound pressure level and the integrated sound pressure level) of each sample. To make comparison between the evaluation results of the samples, the sound pressure level of the sound emitted from the speaker 95 (sound entering each sample) was adjusted so that 1-kHz sound having passed through the sample had a pressure level of 94 dB. The sound entering the sample was sine-wave sound, and its frequency was continuously increased from an initial frequency of 100 Hz at a rate of 100 Hz/second. The sound pressure level and the integrated sound pressure level of the sound passing through the sample and received by the microphone 97 can be automatically determined by the acoustic evaluation apparatus for a given period of measurement. In the present examples, the evaluation of the sound permeation properties of the samples was done by determining the sound pressure level and the integrated sound pressure level of the sound for a period of 20 seconds after the start of the measurement.

Figure 16A:
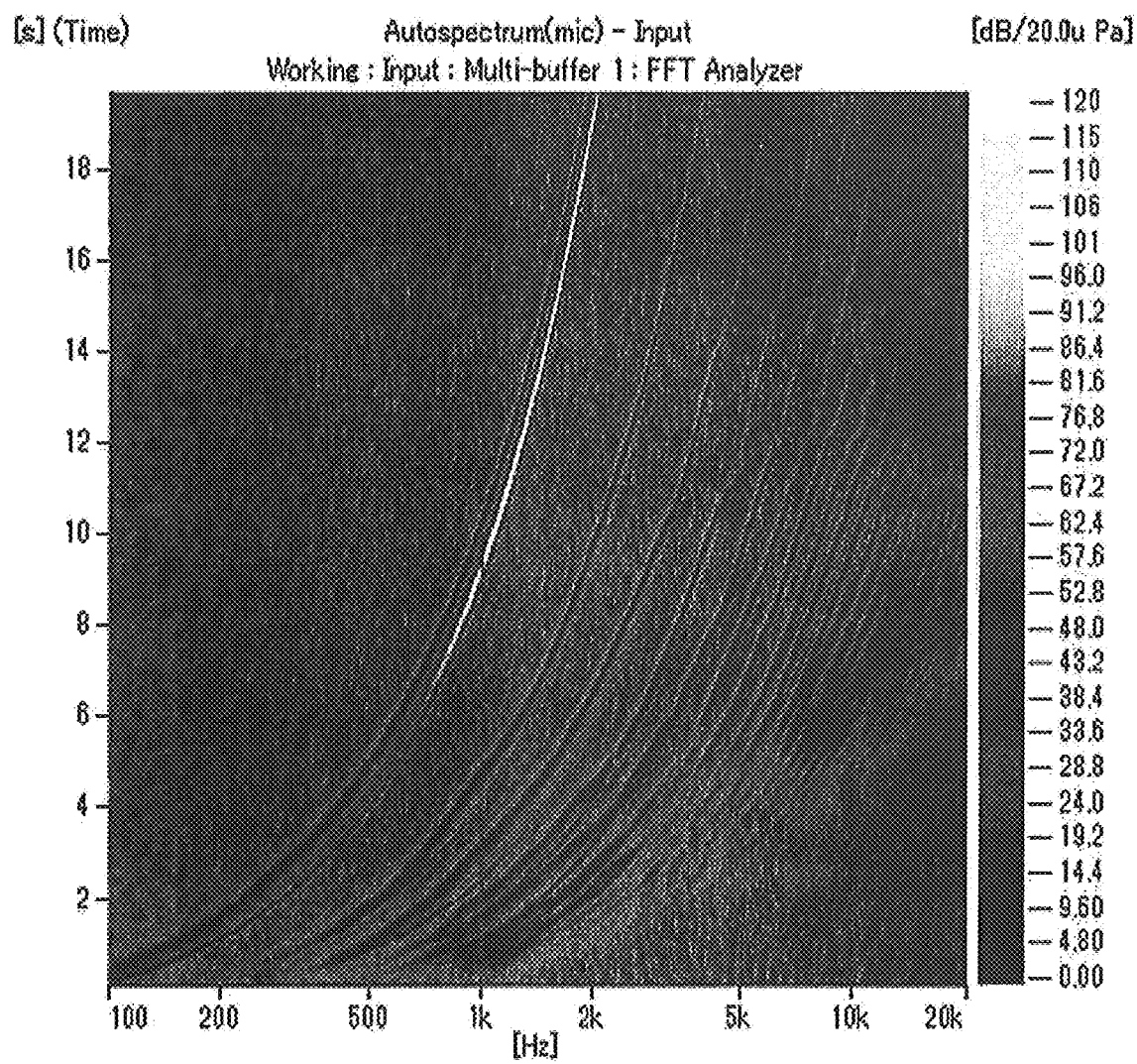
FIG. 16A is a diagram showing the result of FFT analysis of the waterproof sound-permeable membrane prepared in Example 2.

FIG. 16A shows the result of the measurement on the sample using the waterproof gas-permeable membrane (waterproof sound-permeable membrane) prepared in Example 2. In FIG. 16A, the horizontal axis represents the frequency (Hz; logarithmic axis) of the sound received by the speaker, while the vertical axis represents the elapsed time (seconds) from the start of the measurement. The sound pressure level of the sound received by the speaker was originally expressed by difference in color between the graphs as plotted on FIG. 16A, before being expressed by white and black as in the drawings of the present application. On the right side of the FIG. 16A there is shown the relationship between the value of the sound pressure level and the color. FIG. 16A shows a number of plotted curves, the leftmost of which corresponds to the sound (fundamental wave) that entered the sample from the speaker, passed through the membrane as such, and was then received by the microphone. The reason why the plotted graphs are curved is that the horizontal axis is a logarithmic axis. A number of plotted graphs seen on the right of the graph of the fundamental wave correspond to sound generated during passage of the fundamental wave through the membrane and having higher frequency than the fundamental wave. Although the frequency of the sound entering the sample (input wave) varied from 100 Hz only up to 2 kHz over 20 seconds, FIG. 16A reveals that sound in a high-frequency range of 5 kHz to 20 kHz considered to be associated with the generation of chattering noise was detected between about 5 and 12 seconds after the start of the measurement.

For the sample using the membrane of Example 2, the ratio A/B of the integrated sound pressure level A over a frequency range of 100 Hz to 20 kHz to the integrated sound pressure level B over a frequency range of 5 kHz to 20 kHz was 1.28 as determined by the above FFT analysis. The less the generated sound in the frequency range of 5 kHz to 20 kHz, the smaller the integrated sound pressure level B, and hence the greater the ratio A/B. Thus, a greater ratio A/B means that the amount of chattering noise generated during passage of sound through the waterproof sound-permeable membrane is smaller, that is, the waterproof sound-permeable membrane causes less chattering noise.

Additionally, for the sample using the membrane of Example 2, the frequency range of the input wave over which a sound pressure level of 40 dB or more was observed in the 5 kHz to 20 kHz range had a width of 0.7 kHz (minimum frequency of 500 Hz, maximum frequency of 1.2 kHz).

Figure 16B:
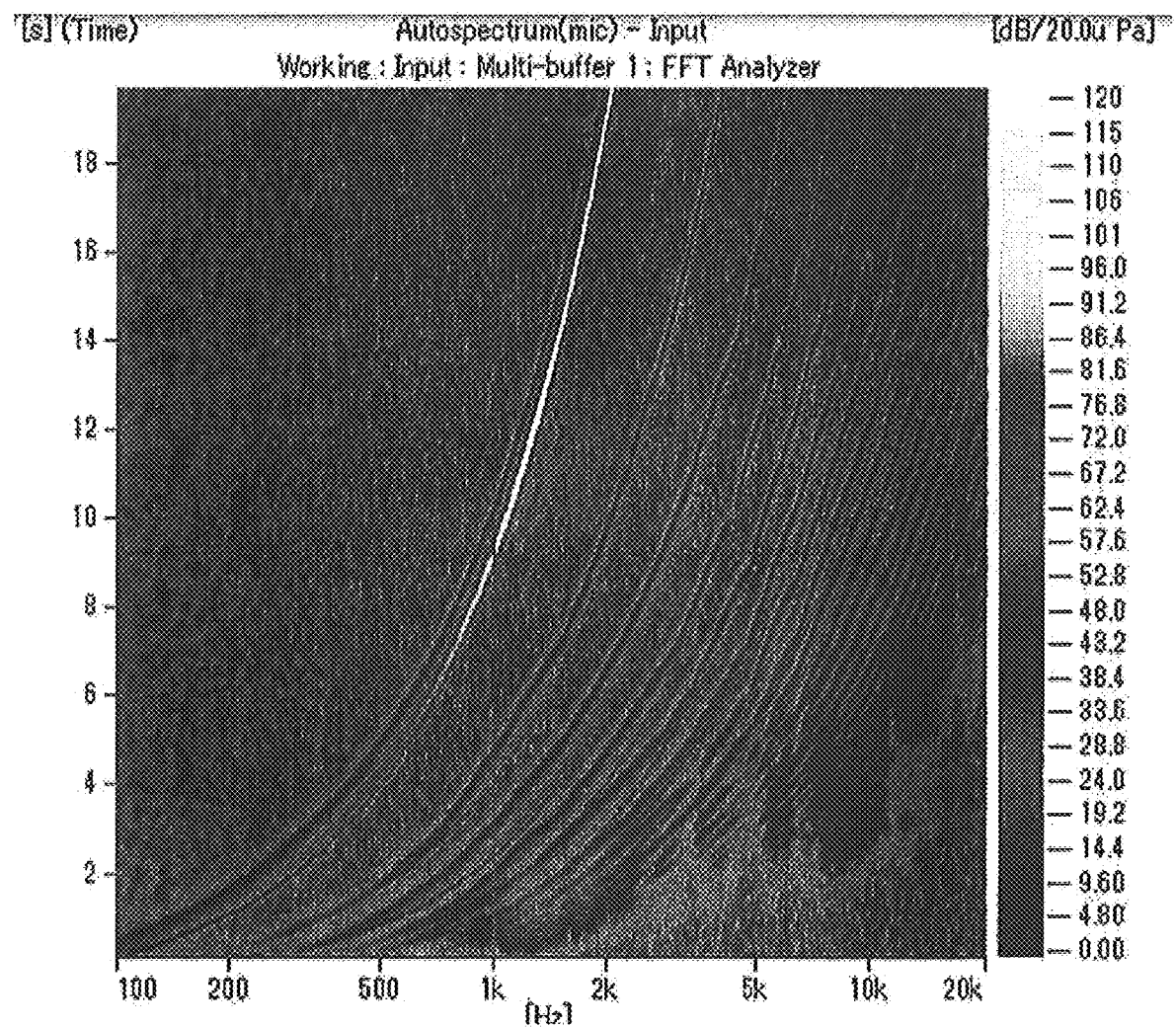
FIG. 16B is a diagram showing the result of FFT analysis of the waterproof sound-permeable membrane prepared in Comparative Example 2.
Figure 16C:
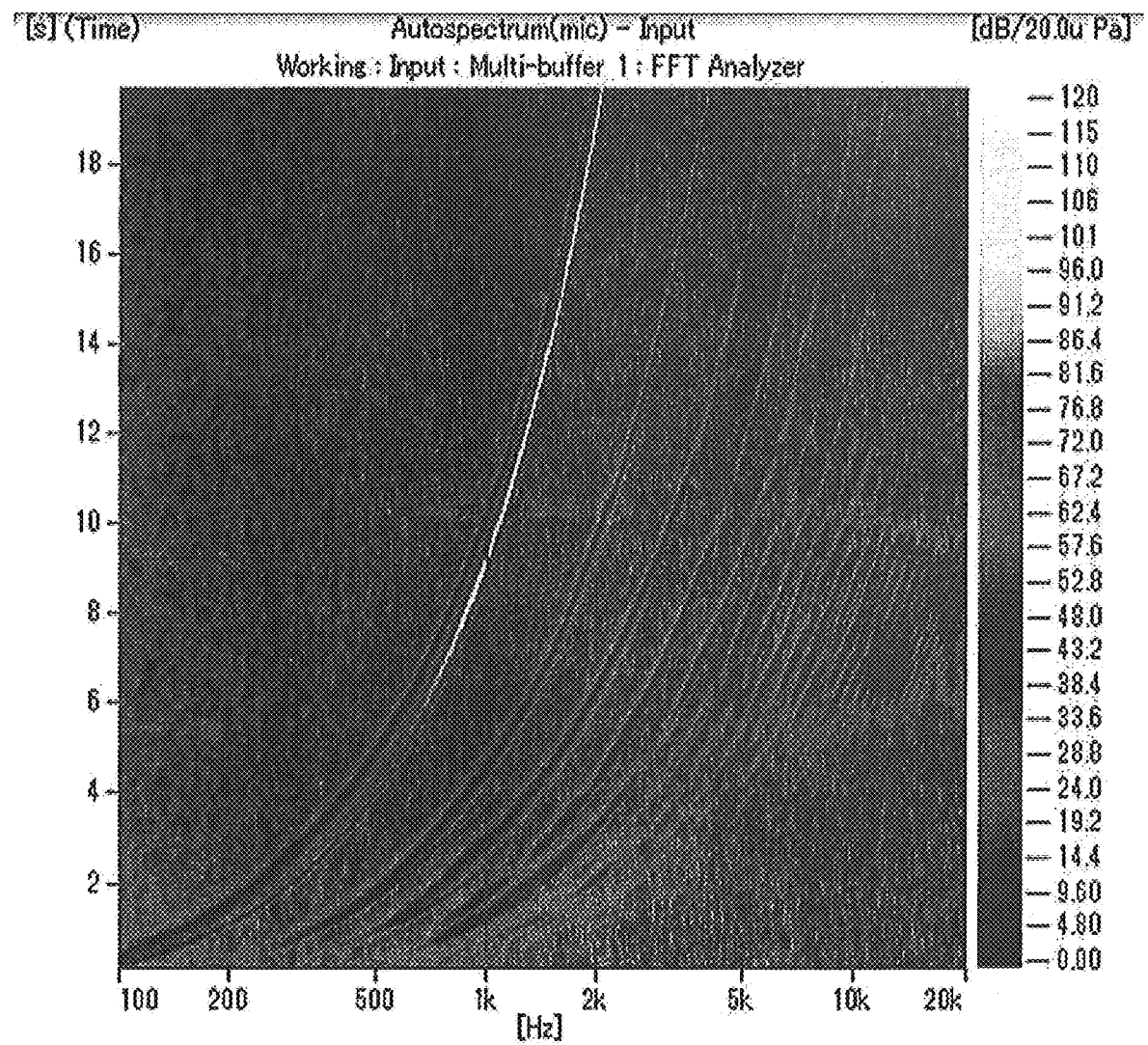
FIG. 16C is a diagram showing the result of FFT analysis of the waterproof sound-permeable membrane prepared in Example 3.
Figure 16D:
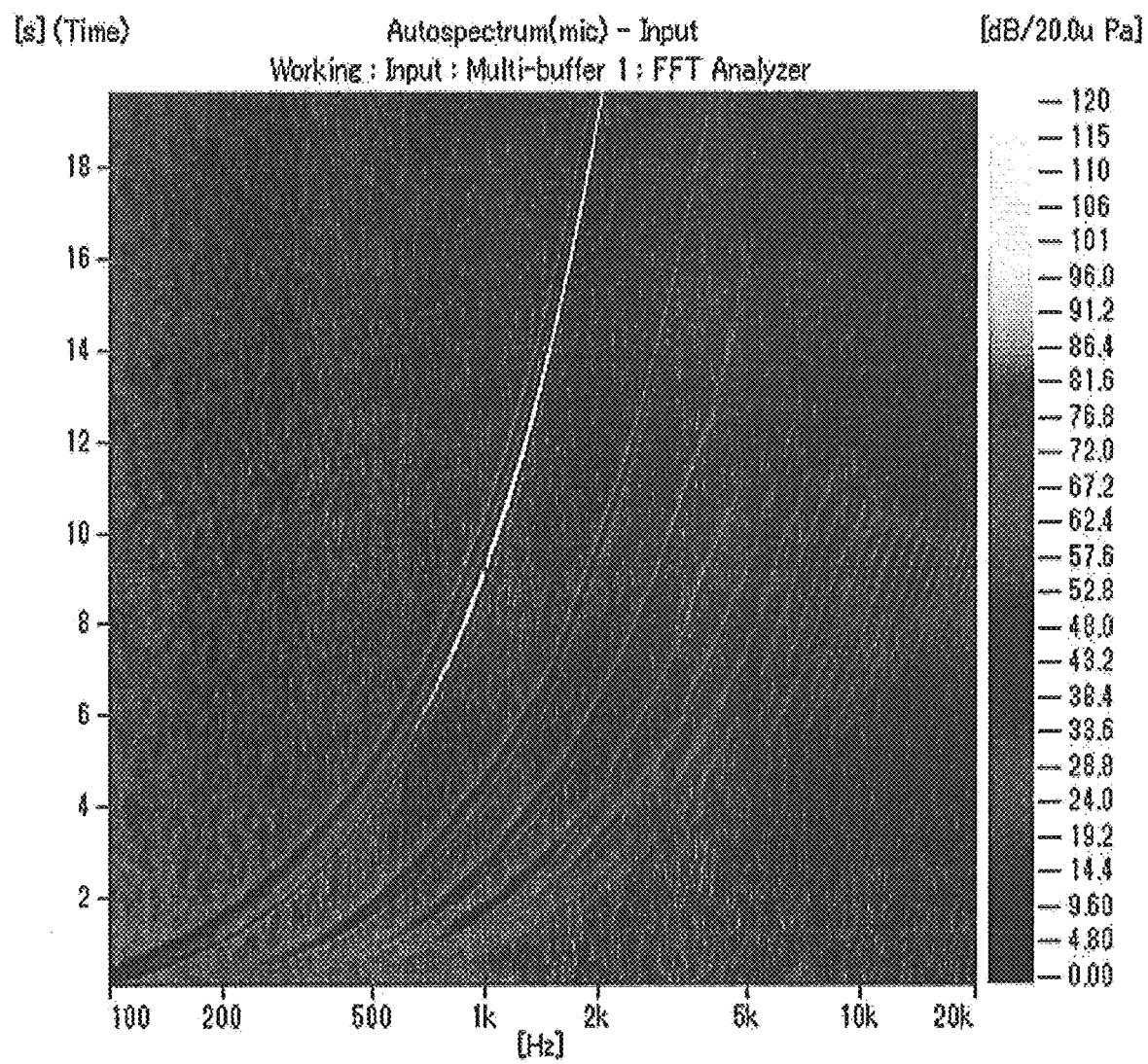
FIG. 16D is a diagram showing the result of FFT analysis of the waterproof sound-permeable membrane prepared in Example 4.

FIG. 16B shows the result of the measurement on the waterproof gas-permeable membrane (waterproof sound-permeable membrane) prepared in Comparative Example 2. FIG. 16B and the subsequent FIGS. 16C and 16D show the measurement results in the same fashion as FIG. 16A. As shown in FIG. 16B, although the frequency of the input wave entering the sample varied from 100 Hz only up to 2 kHz over 20 seconds, sound in the high-frequency range of 5 kHz to 20 kHz considered to be associated with the generation of chattering noise was detected between about 2 and 16 seconds after the start of the measurement.

For the sample using the membrane of Comparative Example 2, the ratio A/B of the integrated sound pressure level A over a frequency range of 100 Hz to 20 kHz to the integrated sound pressure level B over a frequency range of 5 kHz to 20 kHz was 1.15 as determined by the above FFT analysis. Additionally, for the sample using the membrane of Comparative Example 2, the frequency range of the input wave over which a sound pressure level of 40 dB or more was observed in the 5 kHz to 20 kHz range had a width of 1.4 kHz (minimum frequency of 200 Hz, maximum frequency of 1.6 kHz).

FIG. 16C shows the result of the measurement on the waterproof gas-permeable membrane (waterproof sound-permeable membrane) prepared in Example 3. As shown in FIG. 16C, although the frequency of the input wave entering the sample varied from 100 Hz only up to 2 kHz over 20 seconds, sound in a high-frequency range of 5 kHz to 20 kHz considered to be associated with the generation of chattering noise was detected between about 6 and 11 seconds after the start of the measurement.

For the sample using the membrane of Example 3, the ratio A/B of the integrated sound pressure level A over a frequency range of 100 Hz to 20 kHz to the integrated sound pressure level B over a frequency range of 5 kHz to 20 kHz was 1.41 as determined by the above FFT analysis. Additionally, for the sample using the membrane of Example 3, the frequency range of the input wave over which a sound pressure level of 40 dB or more was observed in the 5 kHz to 20 kHz range had a width of 0.5 kHz (minimum frequency of 600 Hz, maximum frequency of 1.1 kHz).

FIG. 16D shows the result of the measurement on the waterproof gas-permeable membrane (waterproof sound-permeable membrane) prepared in Example 4. As shown in FIG. 16D, although the frequency of the input wave entering the sample varied from 100 Hz only up to 2 kHz over 20 seconds, sound in a high-frequency range of 5 kHz to 20 kHz considered to be associated with the generation of chattering noise was detected between about 8 and 10 seconds after the start of the measurement.

For the sample using the membrane of Example 4, the ratio A/B of the integrated sound pressure level A over a frequency range of 100 Hz to 20 kHz to the integrated sound pressure level B over a frequency range of 5 kHz to 20 kHz was 1.89 as determined by the above FFT analysis. Additionally, for the sample using the membrane of Example 4, the frequency range of the input wave over which a sound pressure level of 40 dB or more was observed in the 5 kHz to 20 kHz range had a width of 0.2 kHz (minimum frequency of 800 Hz, maximum frequency of 1.0 kHz).

The results of the FFT analysis are collectively shown in Table 2 below.

TABLE 2

| | Integrated sound pressure level (dB) | | Ratio | Range over which sound having sound pressure of 40 dB or more and frequency of 5 kHz or more is detected | | | |
|---|---|---|---|---|---|---|---|
| | A | B | A/B | Elapsed time from start of measurement (seconds) | Minimum frequency (Hz) | Maximum frequency (kHz) | Width of frequency range (kHz) |
| Example 2 | 151.8 | 118.9 | 1.28 | 4.8 to 12.0 | 500 | 1.2 | 0.7 |
| Comp. Example 2 | 160.9 | 140.1 | 1.15 | 2.0 to 16.0 | 200 | 1.6 | 1.4 |
| Example 3 | 149.8 | 106.4 | 1.41 | 5.6 to 10.5 | 600 | 1.1 | 0.5 |
| Example 4 | 150.9 | 79.9 | 1.89 | 8.0 to 10.2 | 800 | 1.0 | 0.2 |

The disclosure of the present specification include embodiments presented in the items listed below. The present invention is not limited to the embodiments presented below.

1. A waterproof gas-permeable membrane including:
   a non-porous resin film having through holes formed to extend through the thickness of the resin film; and
   a liquid-repellent layer formed on a principal surface of the resin film and having openings positioned in register with the through holes, wherein
   the through holes extend straight and have a diameter of 15 μm or less,
   the through holes are distributed at a hole density of $1\times10^3$ holes/cm$^2$ or more and $1\times10^9$ holes/cm$^2$ or less in the resin film, and
   the resin film has the through holes that extend in oblique directions with respect to a direction perpendicular to the principal surface of the film, and the obliquely-extending through holes that extend in different oblique directions are present together in the resin film.

2. The waterproof gas-permeable membrane as set forth in Item 1, wherein the oblique directions form an angle of 45° or less with the perpendicular direction.

3. The waterproof gas-permeable membrane as set forth in Item 1, wherein the oblique directions form an angle of 30° or less with the perpendicular direction.

4. The waterproof gas-permeable membrane as set forth in any one of Items 1 to 3, wherein the resin film has a set of the through holes that, when viewed in a direction perpendicular to a principal surface of the film, extend from the principal surface in different directions forming an angle of 90° or more.

5. The waterproof gas-permeable membrane as set forth in any one of Items 1 to 4, wherein the resin film has the through holes that cross each other within the film.

6. The waterproof gas-permeable membrane as set forth in any one of Items 1 to 5, wherein the resin film further has the through hole that extend in a direction perpendicular to a principal surface of the film.

7. The waterproof gas-permeable membrane as set forth in any one of Items 1 to 6, having a porosity of 50% or less.

8. The waterproof gas-permeable membrane as set forth in any one of Items 1 to 7, having a through-thickness gas permeability of 0.01 cm$^3$/(cm$^2$·second) or more and 100 cm$^3$/(cm$^2$·second) or less in terms of Frazier number as measured according to JIS L 1096.

9. The waterproof gas-permeable membrane as set forth in any one of Items 1 to 8, having a water entry pressure of 2 kPa or more as measured according to Method B (high hydraulic pressure method) of water penetrating test specified in JIS L 1092.

10. The waterproof gas-permeable membrane as set forth in any one of Items 1 to 9, wherein the resin film is formed of a resin that can be etched with an alkaline solution or an oxidant solution.

11. The waterproof gas-permeable membrane as set forth in any one of Items 1 to 10, wherein the resin film is formed of at least one resin selected from polyethylene terephthalate, polycarbonate, polyimide, polyethylene naphthalate, and polyvinylidene fluoride.

12. The waterproof gas-permeable membrane as set forth in any one of Items 1 to 11, subjected to coloring treatment so as to be capable of absorbing light in a wavelength range of 380 nm to 500 nm.

13. The waterproof gas-permeable membrane as set forth in any one of Items 1 to 11, colored black, gray, brown, or pink.

14. The waterproof gas-permeable membrane as set forth in any one of Items 1 to 13, further including a gas-permeable supporting material stacked on the resin film.

15. A waterproof gas-permeable member including:
   the waterproof gas-permeable membrane as set forth in any one of Items 1 to 14; and
   a supporting member joined to the waterproof gas-permeable membrane.

16. A waterproof gas-permeable structure including:
   a housing having an opening; and
   a waterproof gas-permeable membrane placed to cover the opening, the membrane being adapted to allow passage of gas between the inside and outside of the housing and prevent water from entering the inside from the outside through the opening, wherein the waterproof gas-permeable membrane is the waterproof gas-permeable membrane as set forth in any one of Items 1 to 14.

17. An electronic device including:
a housing having an opening; and
a waterproof gas-permeable membrane placed to cover the opening, the membrane being adapted to allow passage of gas between the inside and outside of the housing and prevent water from entering the inside from the outside through the opening, wherein the waterproof gas-permeable membrane is the waterproof gas-permeable membrane as set forth in any one of Items 1 to 14.

18. An electronic device case for containing an electronic device, the case including:
an opening; and
a waterproof gas-permeable membrane placed to cover the opening, the membrane being adapted to allow passage of gas between the inside and outside of the case and prevent water from entering the inside from the outside through the opening, wherein the waterproof gas-permeable membrane is the waterproof gas-permeable membrane as set forth in any one of Items 1 to 14.

19. A waterproof sound-permeable membrane, including:
a non-porous resin film having through holes formed to extend through the thickness of the resin film; and
a liquid-repellent layer formed on a principal surface of the resin film and having openings positioned in register with the through holes, wherein
the through holes extend straight and have a diameter of 15 pin or less,
the through holes are distributed at a hole density of $1\times10^3$ holes/cm$^2$ or more and $1\times10^9$ holes/cm$^2$ or less in the resin film, and
the resin film has the through holes that extend in oblique directions with respect to a direction perpendicular to the principal surface of the film, and the obliquely-extending through holes that extend in different oblique directions are present together in the resin film.

20. The waterproof sound-permeable membrane as set forth in Item 19, wherein the oblique directions form an angle of 45° or less with the perpendicular direction.

21. The waterproof sound-permeable membrane as set forth in Item 19, wherein the oblique directions form an angle of 30° or less with the perpendicular direction.

22. The waterproof sound-permeable membrane as set forth in any one of Items 19 to 21, wherein the resin film has a set of the through holes that, when viewed in a direction perpendicular to a principal surface of the film, extend from the principal surface in different directions forming an angle of 90° or more.

23. The waterproof sound-permeable membrane as set forth in any one of Items 19 to 22, wherein the resin film has the through holes that cross each other within the film.

24. The waterproof sound-permeable membrane as set forth in any one of Items 19 to 23, wherein the resin film further has the through hole that extend in a direction perpendicular to a principal surface of the film.

25. The waterproof sound-permeable membrane as set forth in any one of Items 19 to 24, having a porosity of 50% or less.

26. The waterproof sound-permeable membrane as set forth in any one of Items 19 to 25, having a through-thickness gas permeability of 0.01 cm$^3$/(cm$^2$·second) or more and 100 cm$^3$/(cm$^2$·second) or less in terms of Frazier number as measured according to JIS L 1096.

27. The waterproof sound-permeable membrane as set forth in any one of Items 19 to 26, having a water entry pressure of 2 kPa or more as measured according to Method B (high hydraulic pressure method) of water penetrating test specified in JIS L 1092.

28. The waterproof sound-permeable membrane as set forth in any one of Items 19 to 27, wherein the resin film is formed of a resin that can be etched with an alkaline solution or an oxidant solution.

29. The waterproof sound-permeable membrane as set forth in any one of Items 19 to 28, wherein the resin film is formed of at least one resin selected from polyethylene terephthalate, polycarbonate, polyimide, polyethylene naphthalate, and polyvinylidene fluoride.

30. The waterproof sound-permeable membrane as set forth in any one of Items 19 to 29, subjected to coloring treatment so as to be capable of absorbing light in a wavelength range of 380 nm to 500 nm.

31. The waterproof sound-permeable membrane as set forth in any one of Items 19 to 29, colored black, gray, brown, or pink.

32. The waterproof sound-permeable membrane as set forth in any one of Items 19 to 31, further including a gas-permeable supporting material stacked on the resin film.

33. The waterproof sound-permeable membrane as set forth in any one of Items 19 to 32, wherein when input sound, having a sine waveform and having its sound pressure level so maintained that 1-kHz sound having passed through the membrane has a sound pressure of 94 dB, is caused to enter an effective area of 132.7 mm$^2$ of the membrane with a continuous increase in frequency of the input sound from an initial frequency of 100 Hz at a rate of 100 Hz/second, a ratio A/B of an integrated sound pressure level A over a frequency range of 100 Hz to 20 kHz to an integrated sound pressure level B over a frequency range of 5 kHz to 20 kHz is 1.16 or more as determined by FFT analysis for sound having passed through the membrane in 20 seconds after the start of the entry of the input sound.

34. The waterproof sound-permeable membrane as set forth in any one of Items 19 to 33, wherein when input sound, having a sine waveform and having its sound pressure level so maintained that 1-kHz sound having passed through the membrane has a sound pressure of 94 dB, is caused to enter an effective area of 132.7 mm$^2$ of the membrane with a continuous increase in frequency of the input sound from an initial frequency of 100 Hz at a rate of 100 Hz/second, a frequency range of the input sound has a width of 1.3 kHz or less, over which a sound pressure level of 40 dB or more is observed in a 5 kHz to 20 kHz range of sound having passed through the membrane in 20 seconds after the start of the entry of the input sound.

35. The waterproof sound-permeable membrane as set forth in any one of Items 19 to 34, wherein when input sound, having a sine waveform and having its sound pressure level so maintained that 1-kHz sound having passed through the membrane has a sound pressure of 94 dB, is caused to enter an effective area of 132.7 mm$^2$ of the membrane with a continuous increase in frequency of the input sound from an initial frequency of 100 Hz at a rate of 100 Hz/second, a maximum frequency in a frequency range of the input sound is 1.5 kHz or less, over which frequency range a sound pressure level of 40 dB or more is observed in a 5 kHz to 20 kHz range of sound having passed through the membrane in 20 seconds after the start of the entry of the input sound.

36. A waterproof sound-permeable member including:
the waterproof sound-permeable membrane as set forth in any one of Items 19 to 35; and
a supporting member joined to the waterproof sound-permeable membrane.

37. A waterproof sound-permeable structure including:
a housing having an opening for allowing transmission of sound between the inside and outside of the housing; and
a waterproof sound-permeable membrane placed to cover the opening, the membrane being adapted to allow transmission of sound between the inside and outside of the housing and prevent water from entering the inside from the outside through the opening,
wherein the waterproof sound-permeable membrane is the waterproof sound-permeable membrane as set forth in any one of Items 19 to 35.

38. An electronic device including:
a housing containing an audio part and provided with an opening for allowing transmission of sound between the audio part and the outside of the housing; and
a waterproof sound-permeable membrane placed to cover the opening, the membrane being adapted to allow transmission of sound between the audio part and the outside of the housing and prevent water from entering the housing from the outside through the opening,
wherein the waterproof sound-permeable membrane is the waterproof sound-permeable membrane as set forth in any one of Items 19 to 35.

39. An electronic device case for containing an electronic device having an audio part, the case including:
an opening provided to allow transmission of sound between the audio part of the electronic device and the outside of the case; and
a waterproof sound-permeable membrane placed to cover the opening, the membrane being adapted to allow transmission of sound between the audio part of the electronic device and the outside of the case and prevent water from entering the case from the outside through the opening,
wherein the waterproof sound-permeable membrane is the waterproof sound-permeable membrane as set forth in any one of Items 19 to 35.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The waterproof gas-permeable membrane of the present invention can be used in the same applications as conventional waterproof gas-permeable membranes. The waterproof sound-permeable membrane of the present invention can be used in the same applications as conventional waterproof sound-permeable membranes.

The invention claimed is:
1. A waterproof gas-permeable membrane comprising:
a non-porous resin film having through holes formed to extend through a thickness of the resin film; and
a liquid-repellent layer formed on a principal surface of the resin film and having openings positioned in register with the through holes, wherein
each of the through holes includes an opening at each principal surface of the non-porous resin film,
the through holes extend straight and have a diameter of 4.5 μm or more and 15 μm or less,
the through holes are distributed at a hole density of $5 \times 10^5$ holes/cm$^2$ or more and $1 \times 10^9$ holes/cm$^2$ or less in the resin film,
the resin film has a porosity of more than 30%, and
the resin film has a first set of the through holes that extend in a first oblique direction with respect to a direction perpendicular to the principal surface of the film, a second set of the through holes that extend in a second oblique direction with respect to the direction perpendicular to the principal surface of the film, and a third set of the through holes that extend in a third oblique direction with respect to the direction perpendicular to the principal surface of the film, wherein:
the first oblique direction, the second oblique direction, and the third oblique direction are each different from one another,
a first angle between the first oblique direction and the direction perpendicular to the principal surface of the film is 10° or more,
a second angle between the second oblique direction and the direction perpendicular to the principal surface of the film is 10° or more,
a third angle between the third oblique direction and the direction perpendicular to the principal surface of the film is 10° or more,
the first oblique direction and the second oblique direction when viewed in a direction perpendicular to the principal surface are at a first angle θ2 of 90° or more and less than 180°,
the first oblique direction and the third oblique direction when viewed in the direction perpendicular to the principal surface are at a second angle θ2 of more than 0° and less than 90°, and
the resin film having a water entry pressure of 2 kPa or more as measured according to Method B (high hydraulic pressure method) of water penetrating test specified in JIS L 1092.

2. The waterproof gas-permeable membrane according to claim 1, wherein the first angle is 45° or less and the second angle 45° or less.

3. The waterproof gas-permeable membrane according to claim 1, wherein the first angle is 30° or less and the second angle is 30° or less.

4. The waterproof gas-permeable membrane according to claim 1, wherein the first set of through holes and the second set of through holes cross each other within the film.

5. The waterproof gas-permeable membrane according to claim 1, wherein the porosity is 50% or less.

6. The waterproof gas-permeable membrane according to claim 1, having a through-thickness gas permeability of 0.01 cm$^3$/(cm$^2$·second) or more and 100 cm$^3$/(cm$^2$·second) or less in terms of Frazier number as measured according to JIS L 1096.

7. The waterproof gas-permeable membrane according to claim 1, wherein the resin film is formed of a resin that can be etched with an alkaline solution or an oxidant solution.

8. The waterproof gas-permeable membrane according to claim 1, wherein the resin film is formed of at least one resin selected from polyethylene terephthalate, polycarbonate, polyimide, polyethylene naphthalate, and polyvinylidene fluoride.

9. The waterproof gas-permeable membrane according to claim 1, subjected to coloring treatment so as to be capable of absorbing light in a wavelength range of 380 nm to 500 nm.

10. The waterproof gas-permeable membrane according to claim 1, which is colored black, gray, blue, brown, green, yellow, or pink.

11. The waterproof gas-permeable membrane according to claim 1, further comprising a gas-permeable supporting material stacked on the resin film.

12. A waterproof gas-permeable member comprising:
the waterproof gas-permeable membrane according to claim 1; and
a supporting member joined to the waterproof gas-permeable membrane.

13. A waterproof gas-permeable structure comprising:
a housing having an opening; and
a waterproof gas-permeable membrane placed to cover the opening, the membrane being adapted to allow passage of gas between the inside and outside of the housing and prevent water from entering the inside from the outside through the opening,
wherein the waterproof gas-permeable membrane is the waterproof gas-permeable membrane according to claim 1.

14. A waterproof sound-permeable membrane, comprising:
a non-porous resin film having through holes formed to extend through the thickness of the resin film; and
a liquid-repellent layer formed on a principal surface of the resin film and having openings positioned in register with the through holes, wherein
each of the through holes includes an opening at each principal surface of the non-porous resin film,
the through holes extend straight and have a diameter of 4.5 μm or more and 15 μm or less,
the through holes are distributed at a hole density of $5 \times 10^5$ holes/cm$^2$ or more and $1 \times 10^9$ holes/cm$^2$ or less in the resin film,
the resin film has a porosity of more than 30%, and
the resin film has a first set of the through holes that extend in a first oblique direction with respect to a direction perpendicular to the principal surface of the film, a second set of the through holes that extend in a second oblique direction with respect to the direction perpendicular to the principal surface of the film, and a third set of the through holes that extend in a third oblique direction with respect to the direction perpendicular to the principal surface of the film, wherein:
the first oblique direction, the second oblique direction, and the third oblique direction are each different from one another,
a first angle between the first oblique direction and the direction perpendicular to the principal surface of the film is 10° or more,
a second angle between the second oblique direction and the direction perpendicular to the principal surface of the film is 10° or more,
a third angle between the third oblique direction and the direction perpendicular to the principal surface of the film is 10° or more,
the first oblique direction and the second oblique direction when viewed perpendicular to the principal surface are at an angle θ2 of 90° or more and less than 180°,
the first oblique direction and the third oblique direction when viewed in the direction perpendicular to the principal surface are at a second angle θ2 of more than 0° and less than 90°, and
when input sound having a sine waveform and having its sound pressure level so maintained that 1-kHz sound having passed through the membrane has a sound pressure of 94 dB, is caused to enter an effective area of 132.7 mm$^2$ of the membrane with a continuous increase in frequency of the input sound from an initial frequency of 100 Hz at a rate of 100 Hz/second,
a ratio AB of an integrated sound pressure level A over a frequency range of 100 Hz to 20 kHz to an integrated sound pressure level B over a frequency range of 5 kHz to 20 kHz is 1.16 or more as determined by FFT analysis for sound having passed through the membrane in 20 seconds after the start of the entry of the input sound.

15. The waterproof sound-permeable membrane according to claim 14, wherein when input sound, having a sine waveform and having its sound pressure level so maintained that 1-kHz sound having passed through the membrane has a sound pressure of 94 dB, is caused to enter an effective area of 132.7 mm$^2$ of the membrane with a continuous increase in frequency of the input sound from an initial frequency of 100 Hz at a rate of 100 Hz/second,
a frequency range of the input sound has a width of 1.3 kHz or less, over which a sound pressure level of 40 dB or more is observed in a 5 kHz to 20 kHz range of sound having passed through the membrane in 20 seconds after the start of the entry of the input sound.

16. The waterproof sound-permeable membrane according to claim 14, wherein when input sound, having a sine waveform and having its sound pressure level so maintained that 1-kHz sound having passed through the membrane has a sound pressure of 94 dB, is caused to enter an effective area of 132.7 mm$^2$ of the membrane with a continuous increase in frequency of the input sound from an initial frequency of 100 Hz at a rate of 100 Hz/second,
a maximum frequency in a frequency range of the input sound is 1.5 kHz or less, over which frequency range a sound pressure level of 40 dB or more is observed in a 5 kHz to 20 kHz range of sound having passed through the membrane in 20 seconds after the start of the entry of the input sound.

17. The waterproof gas-permeable member according to claim 12, wherein
a shape of the supporting member corresponds to a shape of an edge region of the waterproof gas-permeable membrane, and
each surface of the waterproof gas-permeable membrane is exposed with the exception of the edge region on which the supporting member is placed.

18. The waterproof gas-permeable member according to claim 12, wherein the supporting member has a thickness of 5 to 500 μm.

19. The waterproof gas-permeable member according to claim 12, wherein the supporting member has a width of 0.5 to 2 mm.

20. A waterproof sound-permeable member comprising:
the waterproof sound-permeable membrane according to claim 14; and
a supporting member joined to the waterproof sound-permeable membrane.

21. The waterproof sound-permeable member according to claim 20, wherein
- a shape of the supporting member corresponds to a shape of an edge region of the waterproof sound-permeable membrane, and
- each surface of the waterproof sound-permeable membrane is exposed with the exception of the edge region on which the supporting member is placed.

22. The waterproof sound-permeable member according to claim 20, wherein the supporting member has a thickness of 5 to 500 μm.

23. The waterproof sound-permeable member according to claim 20, wherein the supporting member has a width of 0.5 to 2 mm.

24. The waterproof sound-permeable membrane according to claim 14, wherein
- the resin film has a water entry pressure of 2 kPa or more as measured according to Method B (high hydraulic pressure method) of water penetrating test specified in JIS L 1092.

* * * * *